(12) United States Patent
Babić et al.

(10) Patent No.: US 8,674,405 B1
(45) Date of Patent: Mar. 18, 2014

(54) GALLIUM—NITRIDE-ON-DIAMOND WAFERS AND DEVICES, AND METHODS OF MANUFACTURE

(75) Inventors: Dubravko Babić, Santa Clara, CA (US); Firooz Faili, Los Gatos, CA (US); Daniel Francis, Oakland, CA (US); Quentin Diduck, Ithaca, NY (US); Felix Ejeckam, San Francisco, CA (US)

(73) Assignee: Element Six Technologies US Corporation, Santa Clara, CA (US)

(*) Notice: Subject to any disclaimer, the term of this patent is extended or adjusted under 35 U.S.C. 154(b) by 191 days.

(21) Appl. No.: 13/407,588

(22) Filed: Feb. 28, 2012

Related U.S. Application Data

(60) Continuation-in-part of application No. 12/484,098, filed on Jun. 12, 2009, now Pat. No. 8,283,672, which is a continuation of application No. 11/279,553, filed on Apr. 12, 2006, now Pat. No. 7,595,507, application No. 13/407,588, filed on Feb. 28, 2012, which is a continuation of application No. 12/569,486, filed on Sep. 29, 2009, now Pat. No. 8,283,189, which is a division of application No. 11/279,553, filed on Apr. 12, 2006, now Pat. No. 7,595,507.

(60) Provisional application No. 60/671,411, filed on Apr. 13, 2005, provisional application No. 61/447,569, filed on Feb. 28, 2011.

(51) Int. Cl.
*H01L 29/20* (2006.01)
*H01L 23/532* (2006.01)

(52) U.S. Cl.
USPC .......................................... 257/183; 257/615

(58) Field of Classification Search
USPC .......................................... 257/183, 499, 615
See application file for complete search history.

(56) References Cited

U.S. PATENT DOCUMENTS

| | | | | |
|---|---|---|---|---|
| 5,010,033 A | * | 4/1991 | Tokunaga et al. | 117/89 |
| 5,587,210 A | * | 12/1996 | Marchywka et al. | 427/523 |
| 6,794,276 B2 | * | 9/2004 | Letertre et al. | 438/506 |
| 7,595,507 B2 | * | 9/2009 | Francis et al. | 257/76 |
| 2004/0119063 A1 | * | 6/2004 | Guo et al. | 257/13 |
| 2008/0157096 A1 | * | 7/2008 | Linares et al. | 257/77 |

* cited by examiner

*Primary Examiner* — Evan Pert
(74) *Attorney, Agent, or Firm* — Bryan Cave LLP

(57) ABSTRACT

Methods for integrating wide-gap semiconductors, and specifically, gallium nitride epilayers with synthetic diamond substrates are disclosed. Diamond substrates are created by depositing synthetic diamond onto a nucleating layer deposited or formed on a layered structure that comprises at least one layer made out of gallium nitride. Methods for manufacturing GaN-on-diamond wafers with low bow and high crystalline quality are disclosed along with preferred choices for manufacturing GaN-on-diamond wafers and chips tailored to specific applications.

14 Claims, 20 Drawing Sheets

GALLIUM—NITRIDE-ON-DIAMOND WAFERS AND DEVICES, AND METHODS OF MANUFACTURE

This application claims the benefit of U.S. Provisional Patent Application Ser. No. 61/447,569 filed Feb. 28, 2011, and is a continuation-in-part of (a) U.S. patent application Ser. No. 12/484,098 filed Jun. 12, 2009, now U.S. Pat. No. 8,283,672 which is a continuation of U.S. patent application Ser. No. 11/279,553 filed Apr. 12, 2006 (now U.S. Pat. No. 7,595,507) and (b) U.S. patent application Ser. No. 12/569,486 filed Sep. 29, 2009, now U.S. Pat. No. 8,283,189 which is a divisional of U.S. patent application Ser. No. 11/279,553 filed Apr. 12, 2006 (now U.S. Pat. No. 7,595,507), which claims priority from U.S. Provisional Patent Application Ser. No. 60/671,411 filed Apr. 13, 2005, and the disclosures of these applications are incorporated herein by reference.

FIELD OF THE INVENTION

The present invention relates to high-power electronic and optoelectronic devices and their thermal management, and particularly relates to methods for fabricating such devices and structures including integration of synthetic diamond films and wafers with wide-gap semiconductors, and more particularly with gallium nitride-based electronic and optoelectronic devices; including high-electron mobility transistors, radio-frequency (RF) electronic devices, light-emitting-diodes, and lasers.

BACKGROUND OF THE INVENTION

Thermal management in semiconductor devices and circuits is a critical design element in any manufacturable and cost-effective electronic and optoelectronic product, such as light generation and electrical signal amplification. The goal of efficient thermal design is to lower the operating temperature of such electronic or optoelectronic device while maximizing performance (power and speed) and reliability. Examples of such devices are microwave transistors, light-emitting diodes and lasers. Depending on the frequency of operation, power requirements, and specific application, these devices have been conventionally made on silicon, gallium arsenide (GaAs), or indium phosphide (InP). In recent years, gallium nitride (GaN), aluminum nitride (AlN) and other wide-gap semiconductors have surfaced as new choices for both power electronics and visible-light generating optoelectronics. Gallium nitride material system gives rise to microwave transistors with high-electron mobility (necessary for high-speed operation), high breakdown voltage (necessary for high power), and thermal conductivity that is greater than GaAs, InP, or silicon, and thus suitable for use in high power applications. GaN is also used in manufacturing of blue and ultraviolet lasers and light-emitting diodes. In spite of the high-temperature performance (owing to its wide bandgap and high critical field), GaN electronic and optoelectronic devices are limited in performance due to relatively low thermal resistance of the substrates commonly used for growth of GaN. This deficiency is most pronounced in high-power microwave and millimeter-wave transistors and amplifiers where reduced cooling requirements and longer devices life, both benefiting from lower junction temperature, in critical demand. Similar need is exhibited in high power blue and ultraviolet lasers where several-micrometer-wide laser cavity stripe dissipates power into the chip though low thermal conductance materials.

The primary focus of this application is thermal management of high power microwave transistors, but the heat-flow management inventions introduced for microwave devices can be applied for heat management of semiconductor lasers, superluminescent diodes, and light-emitting diodes with departing from the spirit of the invention. The primary device on which the inventions will be described is the AlGaN/GaN high-electron-mobility transistor (HEMT).

The Structure of Conventional AlGaN/GaN HEMTs

Typical epilayer structure of AlGaN/GaN HEMT is shown in FIG. 10 (PRIOR ART). GaN is presently grown on several different substrates: sapphire, silicon, silicon carbide, aluminum nitride, single-crystal diamond, and GaN substrates. With the exception of GaN substrates, all other materials have lattice constants that differ from that of GaN and AlGaN. In order to epitaxially grow high-quality AlGaN alloys on top of substrates with lattice constant different from GaN or AlGaN alloy, it has been common practice in the industry to grow a layer or a combination of layers on top of the lattice-mismatched substrate in order to terminate the dislocations and produce a low-dislocation density epilayer on top of which growth of a high-quality active layers is possible. The active layers and resulting devices may be high-frequency transistors and/or optoelectronic devices such as laser diodes, light-emitting diodes, and super-luminescent diodes. The layers grown on top of the lattice-mismatched substrate are commonly referred to as nucleation layers or transition layers, and they can include any number of binary or ternary epitaxial layers followed by a suitably thick gallium-nitride layer added for achieving low dislocation density. Typical dislocation densities of GaN on silicon, silicon carbide, and sapphire epi-wafers for use in field-effect applications can be between 1 E8 $1/cm^2$ and 1 E9 $1/cm^2$. Defect density required for efficient operation of bipolar devices, such as, bipolar transistors and optoelectronic devices ranges from 1 E6 $1/cm^2$ to 1 E8 $1/cm^2$.

The epilayer structure of a typical AlGaN/GaN HEMT shown in FIG. 10 includes multiplicity of epilayers 9 disposed on top of a native substrate 1. The epilayers 9 can be divided into two functional parts: the transitions layers 8 and active layers 7. The transition layers 8 comprise of at least one layer, but typically a multiplicity of binary and ternary compound semiconductor epitaxial layers that are grown directly on top of the native substrate 1 and then followed by the buffer layer 3. The quality of the epilayers grown on the native substrate 1 improves past the layers 2 as the growth progresses and at some thickness indicated with dashed line 17, the crystal quality (defect density) of the buffer 3 becomes sufficient for high-crystal quality growth of the active layer 7. The active layers 7 comprise multiple epitaxial layers whose number, thickness, and material choices are designed and optimized to perform specific function of the electronic or optical device. For example, for an AlGaN/GaN HEMT, the active layers will typically comprise a barrier layer 6 on top of a layer structure 4 that may include a below-channel barrier to reduce drain-induced barrier lowering as is well known in the art. The barrier layer 6 may furthermore include a several nanometer thick layer of GaN and/or an AlN interlayer to improve the electron mobility in the two-dimensional electron gas 2DEG 5 as is also known in the art. The active layers 7 may comprise multiple layers of AlGaN or InGaN semiconductor alloys or GaN, AlN, InN or any other related material to realize the desired electrical performance of the HEMT. The boundary 17 between the active layers 7 and the transition layers 8 may not be a sharp line as indicated in FIG. 10, because the buffer layer 3 serves other purposes besides reducing the dislocation density. It is needed to electrically separate the transition layers from the electron gas 5 and its thickness may be increased to improve the device breakdown voltage. The exemplary HEMT shown in FIG. 1 will also feature contacts to the transistor denoted with 10 (source), 11 (gate), and 13 (drain). The source 10 and the drain 13 contacts will typically make ohmic contacts to the active layers 7, while the gate 11 will make a Schottky contact to the active layer 7. Additionally, individual HEMTs may be isolated from adjacent devices on the same wafer or chip using isolation trenches 12 or implantation (not shown) to form monolithically integrated circuits on the same chip. The operation of this transistor and device enhancements described above have been described in publicly available literature, such as, books by Rüdiger Quay titled "Gallium Nitride Electronics", and Umesh K. Mishra and J. Singh titled "Semiconductor Device Physics and Design", both books published by Springer in 2008.

GaN-based HEMTs are used for numerous high power applications owing to the high density of electrons in the 2DEG in GaN and the high-breakdown field which lead to high operating currents and voltages, higher than GaAs devices of similar geometry. The dominant heat generation in high-electron mobility transistors occurs in an area between the gate and the drain 15, close to the device surface. In this area, the energy of electrons accelerated with the high drain potential are first converted into optical phonons by electron-phonon scattering and then by phonon-phonon scattering into acoustic phonons which carry heat (heat conduction). Conventionally, the HEMT shown in FIG. 10 is mounted with the back of the substrate 1 down onto a heat sink: The back metallization 16 is attached to a heat sink (not shown in FIG. 1). The heat generated in the active layers of the transistor has to diffuse to the backside of the wafer and be carried away through the backside 16 by the heatsink and dissipated in the ambient. The temperature rise of the active layer relative to the ambient temperature for a given power dissipated by the device is referred to as the thermal resistance and is an essential design parameter for all electronic devices as it determines the device performance and its reliability. It is the objective high-power electronic and opto-electronic design is to minimize the thermal resistance of any device and thereby improve their performance over temperature and reliability.

Thermal resistance of commercial HEMTs with exemplary structure shown in FIG. 10 is dominated by the relatively low thermal conductivity of the layers in the immediate proximity of the active layer, namely, the thermal conductivity of the active layers 7 and the transition layers 8. More specifically, the nucleation layers 2 which are a part of transition layers 8 may comprise ternary compound semiconductor alloys which exhibit low thermal conductivity due to alloy scattering. Finally, some of the materials used commercially for the substrate 1 have low thermal resistance further contributing to the overall thermal resistance of the devices (eg. sapphire, silicon). The result of these materials and structure limitations is that conventional AlGaN/GaN field-effect transistors are limited thermally, but could be made better if its the thermal resistance could be somehow reduced.

There is a need in the industry to improve the thermal performance of AlGaN/GaN HEMTs and similar high-power electronic and optoelectronic devices. This need has spurred a number of investigations in integrating wide-bandgap device active materials with highly thermally conductive substrates by wafer bonding and/or direct growth of wide-gap materials

SUMMARY OF THE INVENTION

This application further improves a method for integrating GaN and CVD diamond to form free-standing GaN-on-diamond substrates suitable for processing as described in U.S. patent application Ser. No. 11/279,553. This application discloses methods for manufacturing of semiconductor-on-diamond engineered wafers which exhibit low wafer bow, improved physical handleability, and result in chips with front-to-back connection that do not involve thru holes on the wafer. This application furthermore discloses multiple semiconductor-on-diamond electronic and optoelectronic device structures. The application specifically discloses preferred GaN-on-diamond HEMT structure, but the inventions disclosed herein may be implemented using other electronics and optoelectronic devices, such as, bipolar transistors, Schottky diodes, microwave diodes, semiconductor lasers, light-emitting diodes, and super-luminescent diodes. The specific areas of GaN-on-diamond technology addressed in this disclosure are given below:

(1) In the epilayer transfer process for producing GaN-on-diamond engineered wafers described in the parent application, further improvements to the structure and the method are needed to further reduce the thermal resistance of any electronic and optoelectronic devices.

(2) Improvement of the epilayer quality of final devices realized by the processes disclosed in the parent application.

(3) Wafers have to be flat. The wafer bow is the difference between the maximum and minimum height of any point on a wafer when it is laid on a flat surface as shown in FIG. 12 and the height is measured in a direction perpendicular to the flat surface. The typical requirement for commercial foundry using a stepper is that the wafer bow one a 100 mm wafer has to be around 20 um or less. This thickness is primarily determined by the time of growth and cost of the wafers. CVD diamond grows with intrinsic strain resulting in unacceptably high bow. For this reason, the mentioned commercial bow specification is very difficult to meet for wafers with diameters greater than 25 mm. It is of critical importance for commercial viability to control the GaN-on-diamond wafer bow and met the specification.

(4) Microwave and milimeter-wave electronic devices critically rely on low-loss transmission lines and interconnects with low parasitic circuit elements. At high frequencies, microstrip configuration is preferred over coplanar-waveguide because of lower conductor losses. However, microstrip configuration requires proximal and high-conductivity return path below the surface of the device. This means that all of the transmission-line electrical connections must have access to the back of the wafers leading to the necessity of having electrical connections through the chip at places determined by the circuit design implemented on the chip. Such connections are known in the art as vias, and are commonly manufactured in GaAs, InP, SiC, and silicon technologies using chemical etching. Diamond is a very hard material and presently there are no commercially demonstrated processes for chemical via etching. Instead, diamond vias are processed by laser drilling. However, thru vias present one difficulty in semiconductor processing: wafers with holes in them cannot be held down using vacuum. Some manufacturers of microwave circuits adopt microwave transmission line architectures that do not require connections between the top and bottom surfaces of the chip, such as coplanar waveguide just to avoid having to make thru holes in the wafer. Microstrip architecture is preferred over coplanar waveguide in many cases because it exhibits lower conductor loss at high frequencies.

There is a clear need in the industry for a low-thermal-resistance AlGaN/GaN-on-diamond wafers that have low bow and exhibit contact between the front and the back of the wafer but allow for processing of the wafers using standard techniques. The preferred embodiments disclosed in this application enable device manufacturing and design improvements that dramatically lower the thermal resistance of any AlGaN/GaN HEMT on new substrates, provide significantly lower bow of the wafers and contact between the front and the back without making thru holes in the wafer.

Terminology:

Wide-gap semiconductor technology refers to electronic and optoelectronic device and manufacturing technology based on wide-gap semiconductors.

Wide-gap semiconductor means (a) semiconductor comprising a bond between nitrogen (N) and at least one Group III element from the Periodic Table of the Elements (boron, aluminum, gallium, indium, and thallium), and (b) semiconductors comprising a bond between carbon (C) and at least one Group IV element from the Periodic Table of the Elements (carbon, silicon, germanium, tin, and lead). Specifically, this application applies, but is not limited to, gallium nitride (GaN), aluminum nitride (AlN), indium nitride (InN), aluminum gallium nitride (AlGaN), indium gallium nitride (InGaN), aluminum indium nitride (AlInN), silicon carbide (SiC), and diamond (C). Any of the mentioned materials (a) or (b) may be single-crystal, polycrystalline, or amorphous.

Single-crystal material, wafer or layer means being of one crystal, namely, having a translational symmetry. This term is common for crystal growth, and is a requirement for most semiconductors. Real semiconductors have defects, but the defect densities are sufficiently low that assuming translational symmetry explains electronic and optical properties of these materials.

Polycrystalline material means consisting of crystals variously oriented or composed of more than one crystal.

Amorphous material means a material having no real or apparent crystalline form.

Synthetic material means man-made material produced artificially, i.e., not natural, while synthetic diamond means man-made diamond.

Synthetic diamond is man made diamond produced by any one of methods known in the art including, but not limited to high-temperature high-pressure technique and chemical vapor deposition (CVD).

CVD diamond includes, but is not limited to hot-filament, microwave plasma, and high-voltage are chemical vapor deposition processes.

Bonding or wafer bonding is a technology in which two surfaces, commonly semiconductor surfaces are brought into proximity and are caused to adhere firmly. The bonding can be achieved by a chemical bonding or using an adhesive. This process is commonly used in the semiconductor technology. See for example book by Tong and Gosele: Semiconductor Wafer Bonding, Springer Verlag, 1989.

Wafer bow is the difference between the maximum and minimum height of any point on a wafer when it is laid on a flat surface as shown in FIG. 12 and the height is measured in a direction perpendicular to the flat surface.

Transition layers are epitaxial layers grown on top of a native substrate 1 of semiconductor S1 with lattice constant x1 and lattice structure L1 in order to enable growth of a semiconductor S2 with lattice constant x2 and lattice structure L2 on top of the native substrate 1, wherein x1 and x2 differ sufficiently to prevent low dislocation-density growth of S2 directly on S1, as is well known in the art. The lattice structure L1 and L2 may or may not be different. For example, L1 may be a face-centered cubic, while L2 may be hexagonal, or both L1 and L2 may be cubic. The requirement on how low the dislocation density has to be is determined by the type of the electronic or optoelectronic device to be fabricated and its performance. The exact structure of the transition layers differs from manufacturer to manufacturer, and for the purposes of this application, transition layers refer to any and all layers required to reach the desired defect/dislocation density so that on top of the transition layers an active layer structure can be grown.

The objective of the present invention is to improve GaN-on-diamond wafers to reach (a) lower thermal resistance and improved epilayer quality, (b) reduce and meet the wafer bow specifications set by commercial foundries, and (c) disclose wafer structures with vias that allow top to bottom electrical connections without having to processes wafers with thru holes, thereby enabling the use of microstrip transmission lines.

This application discloses a number of preferred methods for manufacture of wafers and devices and discloses a number of preferred wafer and device structures that include epilayer structures and device configurations that result in the above-mentioned improvements. Any one of presented methods and embodiments may be used by themselves and in combination with other disclosed embodiments to achieve an improvement in performance.

BRIEF DESCRIPTION OF THE DRAWINGS

To further clarify the above, and understand the advantages and features of the present invention, a more particular description of the invention will be rendered by reference to specific embodiments thereof, which is illustrated in the appended drawings. These drawings depict only typical embodiments of the invention and are therefore not to be considered limiting of its scope. The invention will be described and explained with additional specificity and detail through the use of the accompanying drawings.

DETAILED DESCRIPTION OF THE INVENTION

The following is a list of preferred methods for manufacturing preferred GaN-on-diamond engineered wafers. The disclosed preferred methods may be combined one with another to achieve desired performance and to adapt to a specific application.

Method 100

Figure 1:
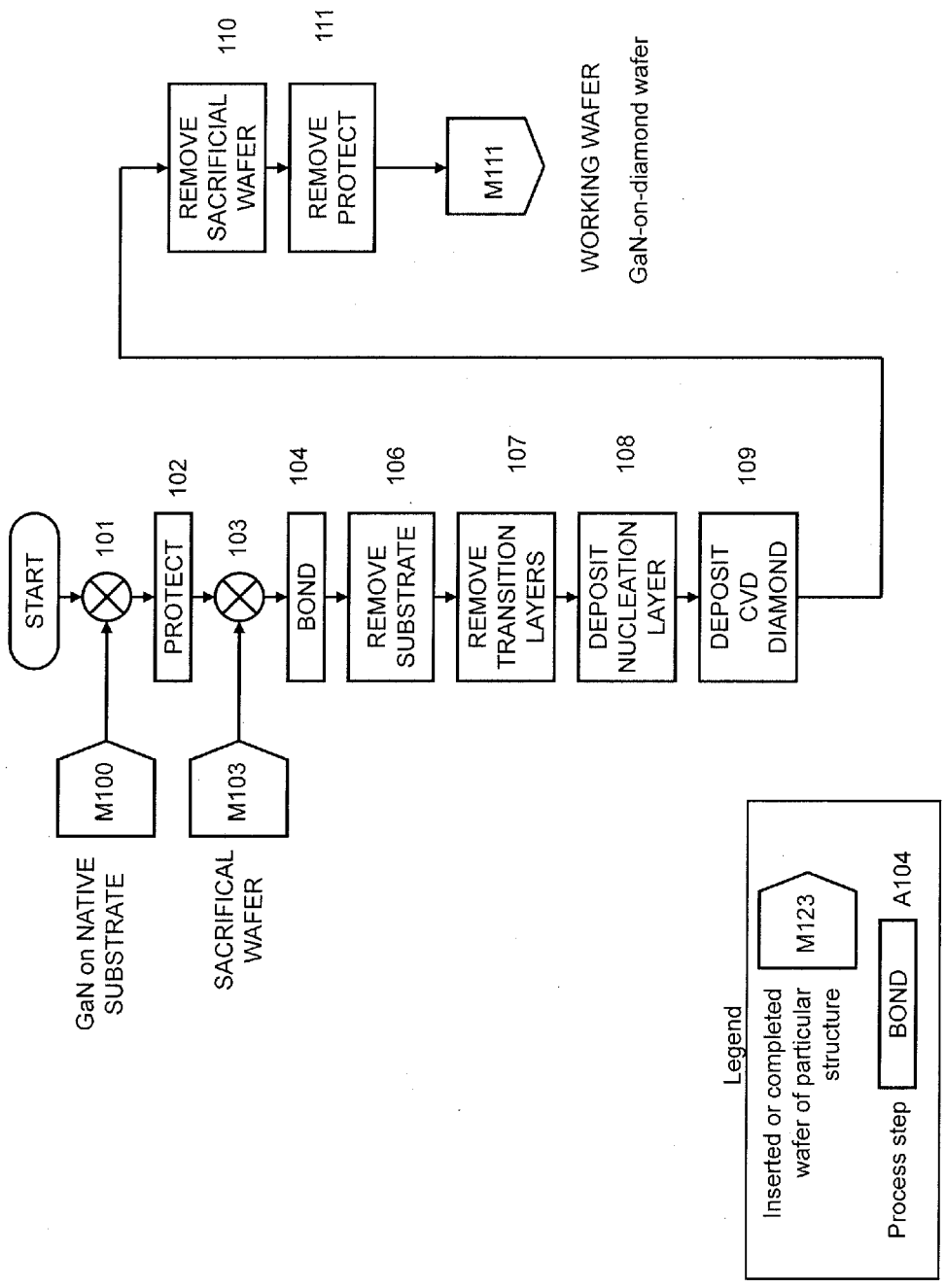
FIG. 1 shows a block diagram illustrating preferred method 100.

Preferred method 100 is explained with the help of a block diagram in FIG. 1. The wafers provided, used, and wafers produced by this method are denoted with label M100, M103, and M111, respectively. In the preferred method 100, an epi-wafer M100 is provided in step 101, wherein the epi-wafer M101 comprises a native substrate and GaN epilayers disposed on top of the native substrate. The top surface if the GaN epilayers is referred to as surface S101. The native substrate may comprise of silicon, silicon carbide, sapphire, aluminum nitride, or gallium nitride. The epilayers comprise at least one layer made our of gallium nitride and transition layers which enable the growth of active layers on top of the native substrate.

In step 102, the top surface S101 of the GaN epilayers is coated with a protect-layer stack: a layer of silicon nitride is deposited on top of surface 101 followed by a layer of polysilicon, and a layer of spin-on glass. The thickness of the silicon nitride is preferably between 20 nm and 100 nm and it is deposited using thermal chemical-vapor deposition process. The thickness of the polysilicon layer is preferably between 50 nm and 2000 nm and the layer is deposited using thermal chemical-vapor deposition. The resulting wafer is referred to as wafer M102 and the surface of wafer M102 with the protect-layer stack is referred to as the protected surface S102 of wafer M102.

In step 103, a sacrificial wafer M103 is provided. The sacrificial wafer M103 is preferably made out of silicon (100) or (110) and features preferably at least one surface S103 that is polished.

In step 104, the sacrificial wafer M103 is joined with wafer M102 so that the polished surface S103 of wafer M103 is adjacent to the protected surface S102 of wafer M102 producing wafer sandwich M104. The wafer sandwich M104 is exposed to under axial pressure of at least 10 MPa and elevated temperature exceeding 900° C. During which the wafer sandwich bonds forming a composite wafer M105. The composite wafer is subsequently cooled to room temperature.

In step 106, the native substrate constituting wafer M100 is removed by a combination of chemical and mechanical polishing, and dry chemical etching down to the transition layer resulting in composite wafer M106.

In step 107, the transition layers are removed by a combination of wet chemical and/or dry etching though dry process is preferred. The removal of the transition layers optionally includes removal of a part of the GaN buffer. The surface revealed by etching is referred to as surface S107.

In step 108, a nucleation layer for chemical-vapor deposition of diamond is deposited on top of surface S107. The nucleation layer is preferably made out of an amorphous or polycrystalline material. In one embodiment, the nucleation layer is made out of silicon nitride, and in another embodiment, the amorphous or polycrystalline nucleation layer is made out of aluminum nitride. In one embodiment the preferred thickness of the nucleation layer is between 1 nm and 50 nm.

In step 109, a layer of diamond is deposited on the surface S107 by chemical-vapor deposition. In embodiment, the preferred thickness of the diamond layer is 100 um±20 um. In yet another embodiment, the preferred thickness of the diamond layer ranges from 25 um to 300 um.

In step 110, the sacrificial wafer M102 is removed wet chemical etching.

In step 111, the all or one part of the protect-layers are removed by wet chemical etching. The glass and polysilicon are removed by one of wet etch chemistries known in the art that do not attach silicon nitride. In one embodiment, the silicon nitride layer is removed by wet chemical etching in hydrofluoric acid, and the completed wafer has a bare GaN-epilayer surface and is referred to as working wafer M111. In another embodiment, the silicon nitride is not removed and is left for removal at a later stage in the process, the completed wafer coated with silicon nitride on top is referred to as working wafer M112.

In one embodiment, the working wafers M111 or M112 contain epilayers which will be processed into high-electron-mobility transistors, Schottky diodes, microwave diodes, or complete microwave or millimeter-wave integrated circuits. In yet another embodiment, the wafers M111 or M112 contain epilayers which will processed into semiconductor lasers, light-emitting diodes, or super-luminescent diodes.

Method 200

Figure 2:
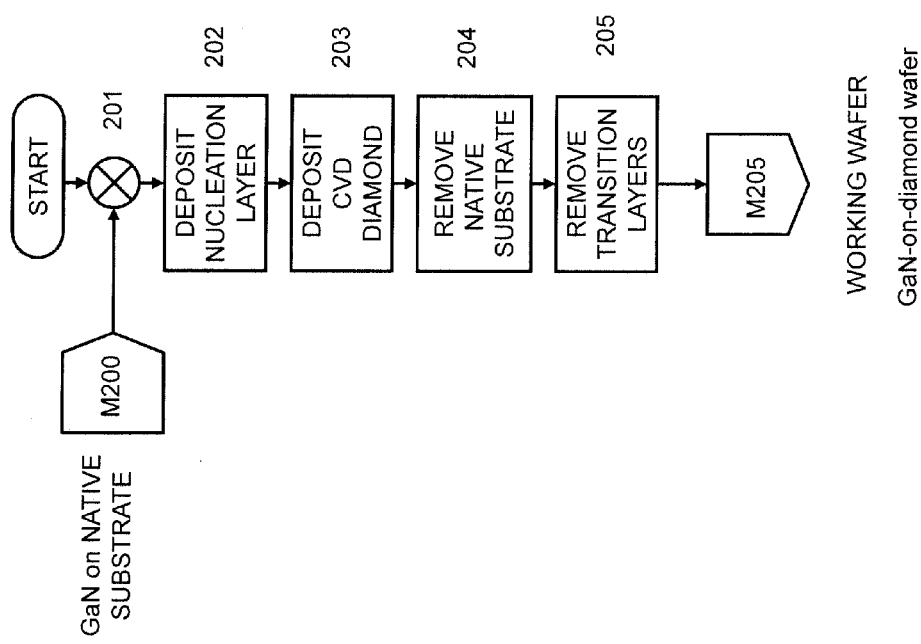
FIG. 2 shows a block diagram illustrating preferred method 200.

Preferred method 200 is explained with the help of a block diagram FIG. 2. The wafers provided and wafers produced by this method are denoted with label M200 and M205, respectively. In the preferred method 200, an epiwafer wafer M200 is provided in step 201, wherein the epiwafer wafer M200 comprises a native substrate and GaN epilayers disposed on top of the native substrate. The native substrate may comprise of silicon, silicon carbide, sapphire, aluminum nitride, or gallium nitride. The epilayers comprise at least one layer made our of gallium nitride and of transition layers which enable the growth of active layers on top of the native substrate. The top surface of GaN epilayers is referred to as surface S201.

In step 202, a nucleation layer for chemical-vapor deposition of diamond is deposited on top of surface S201. The nucleation layer is preferably made out of an amorphous or polycrystalline material. In one embodiment, the nucleation layer is made out of silicon nitride, and in another embodiment, the amorphous or polycrystalline nucleation layer is made out of aluminum nitride. In one embodiment the preferred thickness of the nucleation layer is between 1 nm and 50 nm.

In step 203, a layer of diamond is deposited on the surface S201 by chemical-vapor deposition. In this embodiment, the preferred thickness of the diamond layer is 100 um±20 um. In yet another embodiment, the preferred thickness of the diamond layer ranges from 25 um to 300 um.

In step 204, the native substrate constituting wafer M200 is removed by a combination of chemical and mechanical polishing, and wet chemical etching down to the GaN epilayers resulting in composite wafer M204.

In step 205, the transition layers and the GaN buffer constituting the wafer M204 are removed by a combination of wet chemical and/or dry etching. In one embodiment, additional epilayers are removed so that the surface of device active layers are revealed. The completed wafer is referred to as working wafer M205.

Method 300

Figure 3:
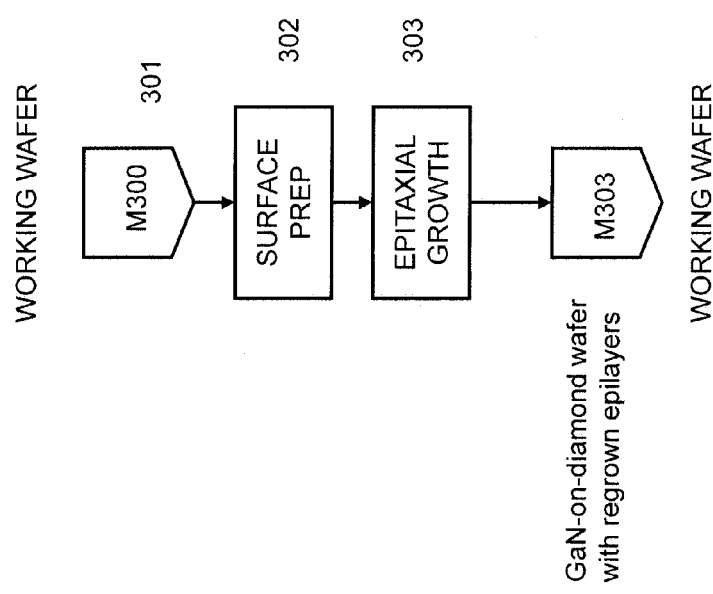
FIG. 3 shows a block diagram illustrating preferred method 300.

Preferred method 300 is explained with the help of a block diagram FIG. 3. The wafers provided and wafers produced by this method are denoted with label M300 and M305, respectively. In the preferred method 300, a working wafer M300 is provided in step 301. The surface of wafer M300 with the epitaxial layers is referred to as the epi surface S301.

In step 302, the epilayer surface S301 of working wafer M300 is prepared for epitaxial growth by either wet or dry etching step. Wet etch preparation of the surface can be achieved using KOH in combination with a UV light source, or alternatively by electrochemical reduction of the surface using an appropriate solution. This step includes removing a finite thickness of epilayers in order to facilitate epitaxial growth of GaN on that surface. The resulting surface is referred to as S302.

In step 303, an active epilayer structure is epitaxially grown on top of the epilayer surface S302 of wafer M300. In one embodiment, the epilayer structure resulting from this epitaxial growth is part of an AlGaN/GaN HEMT, a semiconductor laser, a light-emitting diode, or a super-luminescent diode. The working wafer resulting from method 300 is referred to as working wafer M303 and the resulting surface with GaN epilayers exposed is referred to as surface S303.

Method 400

Figure 4:
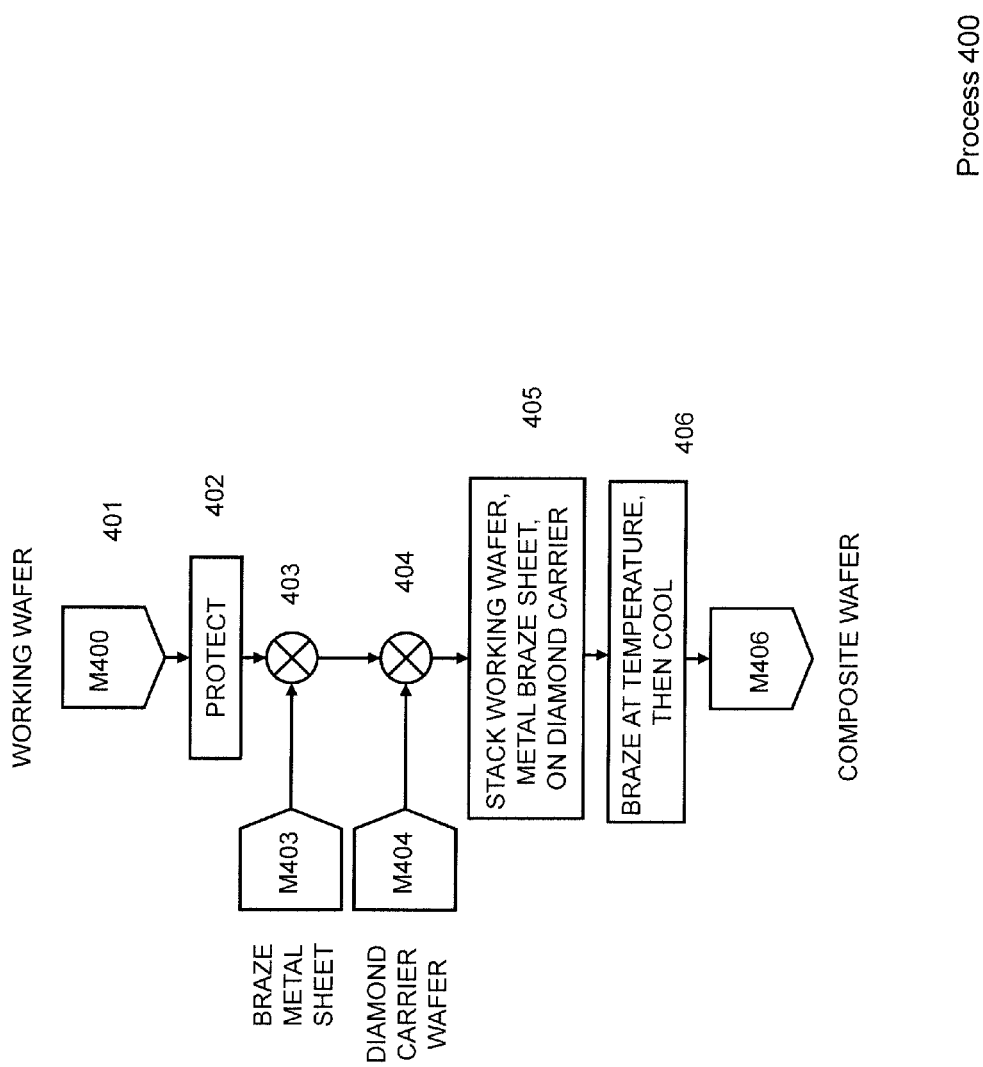
FIG. 4 shows a block diagram illustrating preferred method 400.

Preferred method 400 is explained with the help of a block diagram FIG. 4. The wafers provided, used, and wafers produced by this method are denoted with label M400, M404, and M406, respectively. In the preferred method 400, a working wafer M400 is provided in step 401. The working wafer M400 comprises two surfaces, the first surface S401 terminated with diamond and the second surface S402 terminated with epilayers which may or may not be coated with silicon nitride.

In step 402, the surface S402 is protected. If the top surface of the provided wafer M400 is already coated with silicon nitride in a previous process step, as it would after processes 200 or 300, this step is omitted. In another embodiment, if the surface S402 is bare (GaN epilayers), the surface S402 is coated with a layer of silicon nitride with thickness of approximately 50 nm using one of known silicon nitride deposition techniques. The thickness of the silicon nitride layer is not critical. The silicon-nitride coated GaN-epilayer surface at the end of step 402 is from now on referred to as surface S402.

In step 403, a sheet of brazing metal M403 is provided. For bonding and adhering to diamond, the braze metal includes a refractory metal such as titanium. In one embodiment, the brazing metal sheet M403 has been patterned with a desired metal connection pattern to be embedded into the structure.

In step 404, a diamond carrier wafer M404 is provided, the diamond carrier wafer having a thickness and having both surfaces polished. The thickness of the diamond carrier wafer is preferably between 200 um and 2000 um, depending on the size of the wafer. Larger wafers may need thicker diamond carrier wafers. Such diamond carrier wafers are available from commercial diamond supplies, such as, Element Six, UK. In one embodiment, the diamond carrier wafer has thickness 500 µm±50 µm, flatness better than 20 µm across full area, and surface roughness on top and bottom surfaces Ra<250 nm.

In step 405, the brazing metal sheet M403 is placed between the diamond carrier wafer M404 and the working wafer M400 so that the first surface of working wafer M400 is proximal to the diamond carrier wafer M404, resulting in a wafer sandwich M405.

In step 406, the brazing wafer sandwich M405 is fired at an elevated temperature that preferably comprises a fast ramp to a temperature between 870° C. to 920° C., a short soak sufficient to reflow the brazing metal (depends on the composition of the brazing metal) and a cool down. The resultant bond between the two diamond wafers contains TiC which facilitates bonding between the diamond and the brazing alloy. The resulting bonded wafer is referred to as composite wafer M405 and the metal layer sandwiched between the two diamond layers is referred to as the buried metal layer M406. The advantage of this wafer structure is that that both the diamond serving as the substrate for working wafer M400 and the diamond carrier wafer M404 have approximately equal thermal expansion coefficients and hence the composite wafers resulting from bonding of the two wafers exhibits very low bow over a large temperature range and become suitable for commercial foundry processing.

Method 500

Figure 5:
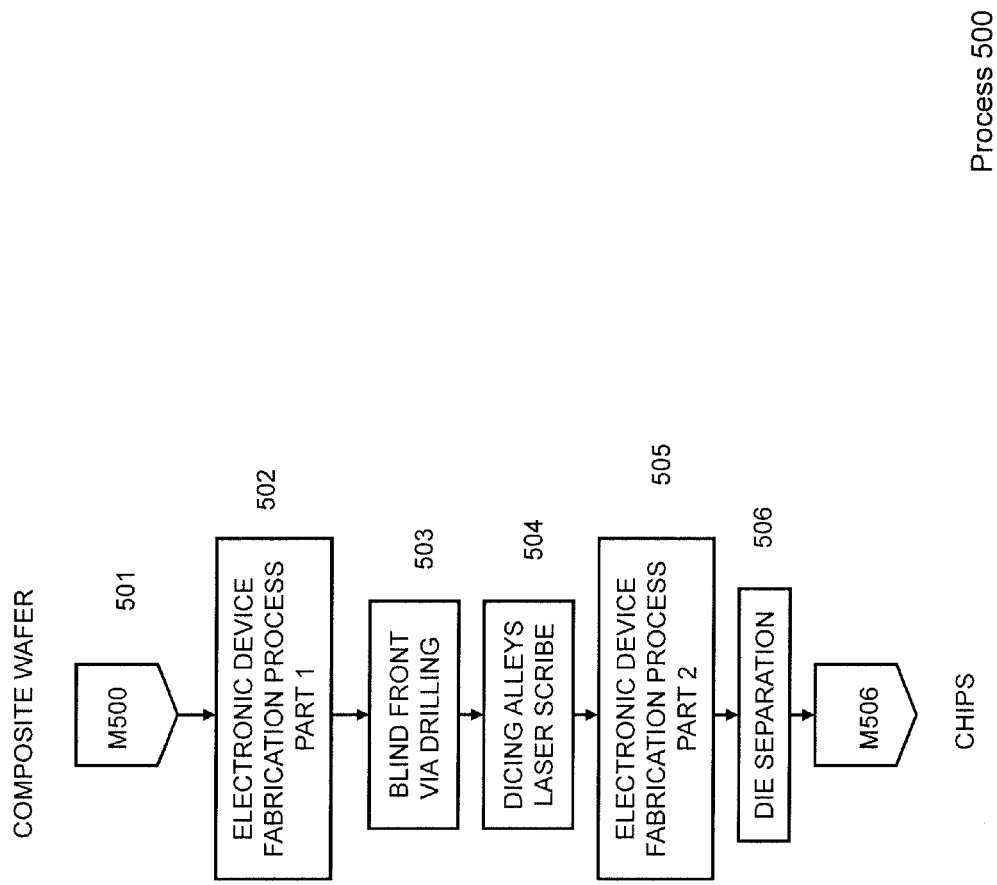
FIG. 5 shows a block diagram illustrating preferred method 500.

Preferred method 500 is explained with the help of a block diagram FIG. 5. The wafers provided and wafers produced by this method are denoted with label M500 and M505, respectively. In the preferred method 500, an engineered wafer M500 is provided in step 501. The engineered wafer M500 comprises two surfaces, the first surface S501 terminated with diamond and the second surface S502 terminated with epilayers.

In step 502, the wafer M500 is processed using standard semiconductor device processing techniques to form devices up to via formation. This step may be omitted if via formation occurs at the beginning of the device formation. The device process will depend on the type of device desired and the critical dimensions, as is well known in the art. The process comprises, but is not limited to metallization steps for ohmic contact realization, chemical etching, and dielectric coating depositions. The resulting wafer is referred to as in-process wafer M502.

In step 503, vias are formed in the wafer M502. In one embodiment, blind vias are formed and extend from first surface S501 and to the buried metal layer M406. In one embodiment, the vias protrude past the buried metal layer. In one embodiment, the vias are fabricated by laser drilling. In one embodiment, chemical etching is used to fabricate the vias. In yet another embodiment, the vias as fabricated using a combination of laser drilling, followed by chemical etching. This latter embodiment is particularly useful when the vias must end at a specific depth defined by an etch stop layer or a metal layer. The resulting wafer is referred to as in-process wafer M503.

In step 504, the wafer M503 is optionally laser-scribed to prepare the wafer M503 for cleaving into chips.

In step 505, the wafer M503 is further processed using standard semiconductor device processing techniques to complete the devices on its surface. This step includes the metallization of the blind vias using sputtering and/or evaporation and/or electroplating of metal into the vias to accomplish an electrical contact between the top surface and the buried metal layer. The resulting wafer is referred to as in-process wafer M505.

In step 506, the in-process wafer M505 is cleaved or diced into chips M506.

Method 600

Figure 6:
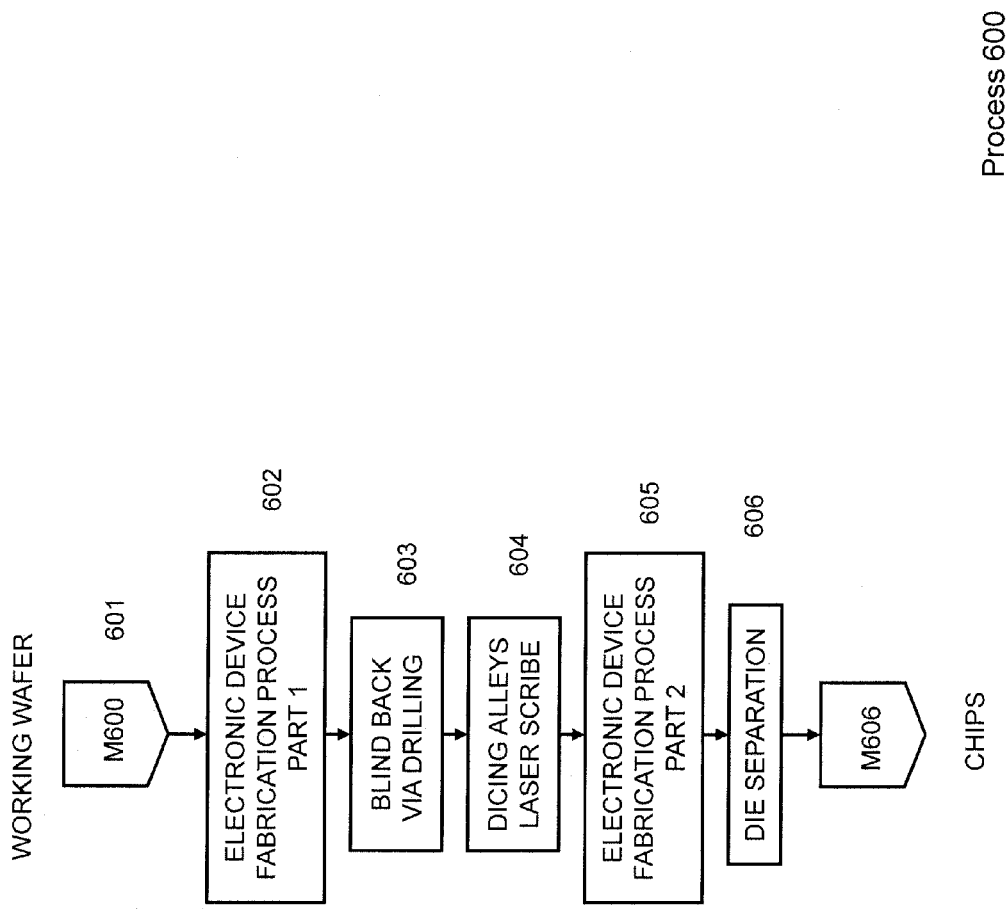
FIG. 6 shows a block diagram illustrating preferred method 600.

Preferred method 600 is explained with the help of a block diagram FIG. 6. The wafers provided and wafers produced by this method are denoted with label M600 and M605, respectively. In the preferred method 600, an engineered wafer M600 is provided in step 601. The engineered wafer M600 comprises two surfaces, the first surface S601 terminated with diamond and the second surface S602 terminated with epilayers.

In step 602, the wafer M600 is processed using standard semiconductor device processing techniques to form devices up to via formation. This step may be omitted if via formation occurs at the beginning of the device formation. The device process will depend on the type of device desired and the critical dimensions, as is well known in the art. The resulting wafer is referred to as in-process wafer M602.

In step 603, vias are formed in the wafer M602. In one embodiment, denoted with 603A, thru vias are formed by laser drilling from surface S601 of wafer M602 to the surface S602 of wafer M602. In yet another embodiment, denoted 603B, blind vias are formed starting from the first surface S601 of the wafer M600 and terminating at the front surface S602 in areas that have been previously coated with metal layer. In one embodiment, chemical etching is used to fabricate the vias. In yet another embodiment, the vias as fabricated using a combination of laser drilling, followed by chemical etching wherein chemical etching is selective between diamond and the metal appearing on the front surface of the device where the vias is located. The resulting wafer is referred to as in-process wafer M603.

In step 604, the wafer M603 is optionally laser-scribed to prepare the wafer M603 for cleaving into chips.

In step 605, the wafer M603 is further processed using standard semiconductor device processing techniques to complete the devices on its surface. This step includes the metallization of the blind vias using sputtering and/or evaporation and/or electroplating of metal into the vias to accomplish an electrical contact between the top surface and the buried metal layer. Alternatively solder is reflowed to fill the via holes, this may be used separately, or in combination with any of the above metallization methods. The resulting wafer is referred to as in-process wafer M605.

In step 606, the in-process wafer M605 is cleaved or diced into chips M606.

The following is the description of preferred wafer structures to be used in conjunction with the preferred methods 100-600.

Figure 7A:
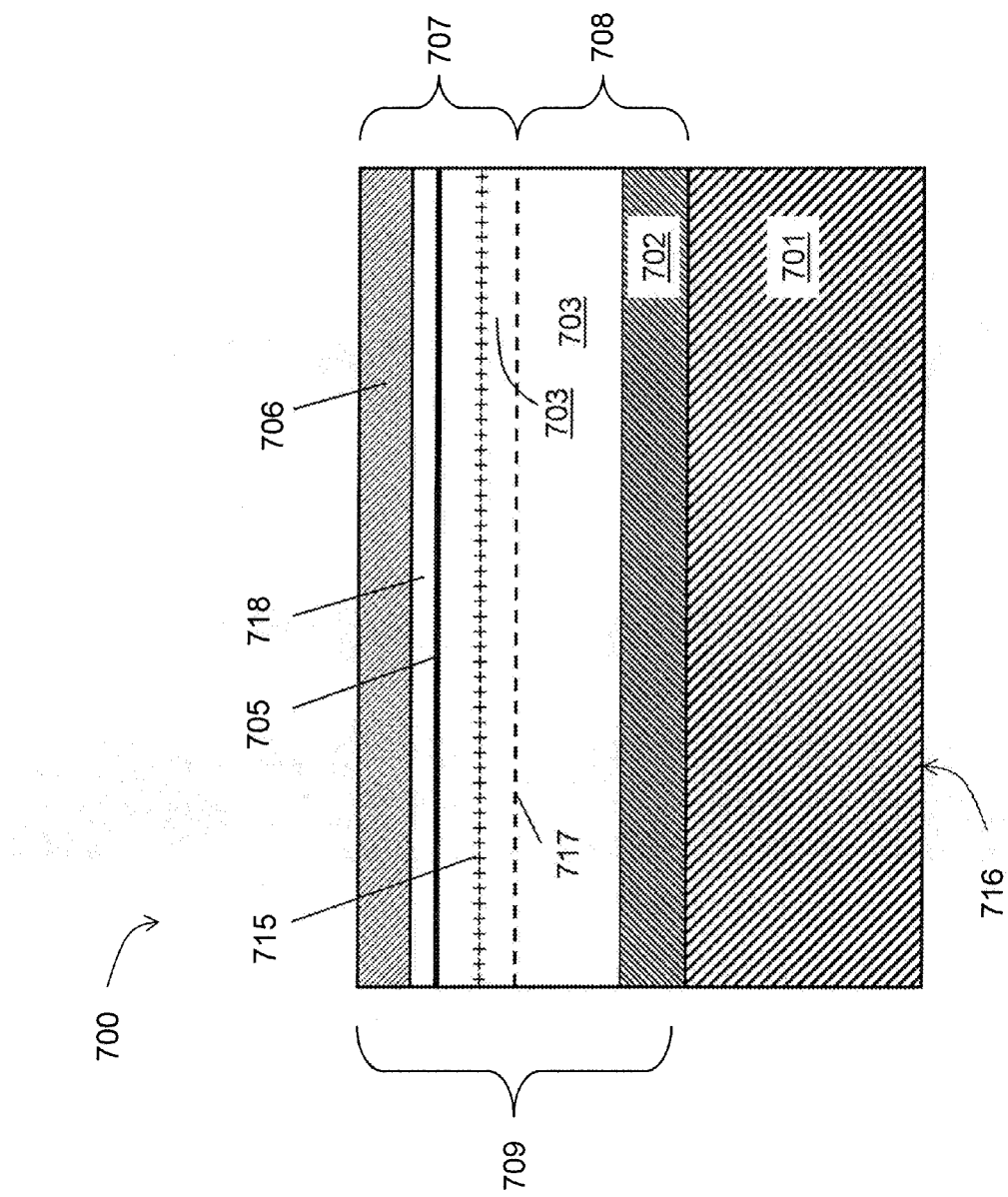
FIG. 7A illustrates a preferred wafer structure 700

Preferred Wafer Structure 700 is described with help of FIG. 7A and comprises of epilayers 709 grown on a native substrate 701. The epilayers 709 comprise transition layers 708 disposed on top of a native substrate 701, active layers 707 disposed on top of the transition layers 708. The active layers 707 comprise a buffer layer 703, barrier layer 706, a 2DEG 705, and may include a back barrier 715 and MN interfacial layer 718. The materials may include any binary, ternary, quaternary alloy involving Ga, Al, In, B, and N atoms. The boundary between 717 the active layers 707 and the transition layers 708 may be or may not be physically defined but may be defined functionally. The preferred wafer structure M700 represents an AlGaN/GaN HEMT and the active layers are grown on the Ga-face. In one embodiment of present invention, the native substrate is made out of silicon. The native substrate may be made out of silicon carbide, sapphire, an aluminum nitride without departing from the spirit of the invention. In one embodiment of the present invention, wafers with preferred design M700, but not limited to design M700, are provided as starting material to process 100.

Figure 7B:
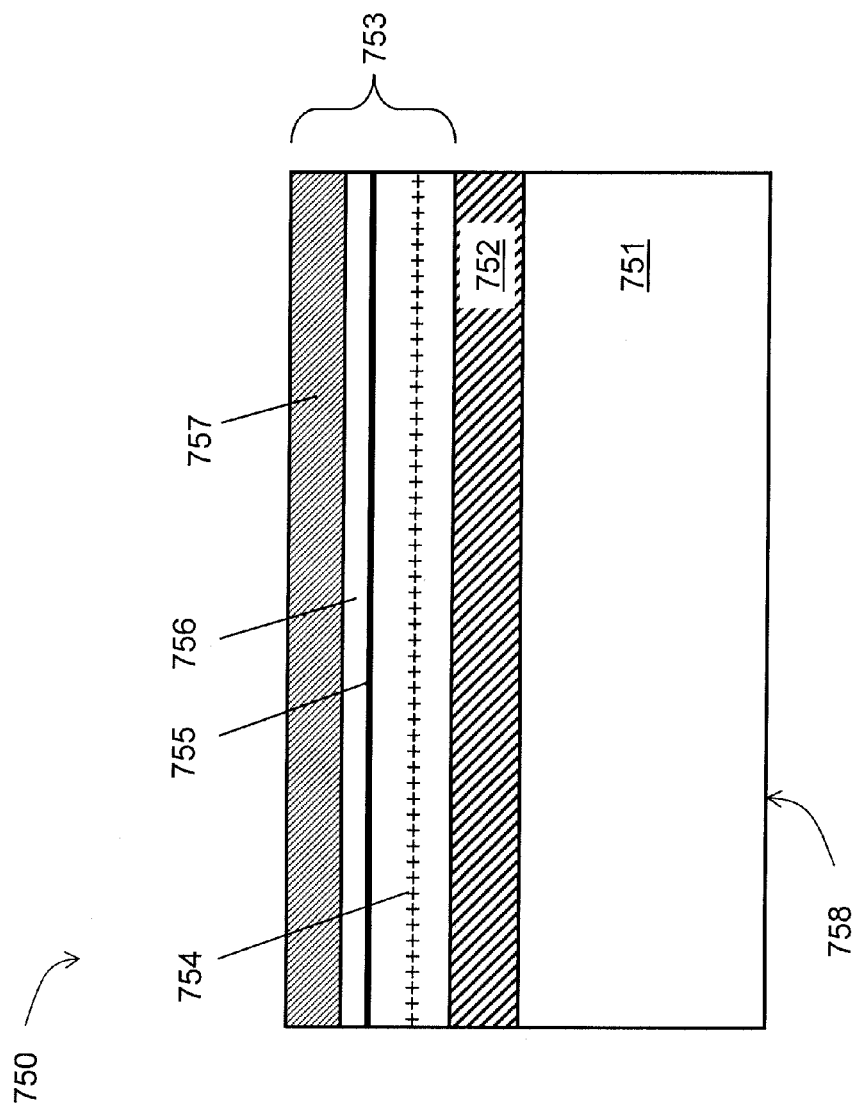
FIG. 7B illustrates a preferred wafer structure 750

Preferred Wafer Structure 750 is described with help of FIG. 7B and comprises a diamond-growth nucleation layer 752 disposed on top of a diamond wafer 751, and epitaxial layers 753 disposed on top of the diamond-growth nucleation layer 752. The crystalline quality of epitaxial layers 753 is sufficient for operation of an electronic or optoelectronic device. In one embodiment, the epitaxial layer 753 correspond to the active layers of a HEMT and in this case the epitaxial layers comprise at least of a barrier layer 757 which may include a several nanometer thick GaN coating and 2DEG 755, and may include a back barrier 754 and MN interfacial layer 756. The epitaxial layers 753 may comprise any binary, ternary, quaternary alloys combining Ga, Al, In, B, and N atoms. In one embodiment, the diamond-growth nucleation layer 752 has thickness between 1 nm and 50 nm. In another embodiment, the diamond-growth nucleation layer 752 is made out of silicon nitride. In yet another embodiment, the diamond-growth nucleation layer 732 is made out of amorphous or polycrystalline material. In yet another embodiment, the total thickness of the epitaxial layers 753 on top of the diamond-growth nucleation layer 752 is preferably 500 nm, and yet in another embodiment, the thickness is between 100 nm and 2000 nm. In embodiment, the barrier layer is coated with a layer of silicon nitride (not shown in FIG. 7B) to be removed in a later process step. The thickness of this silicon nitride layer is generally 50 nm, but it is not critical.

Figure 7C:
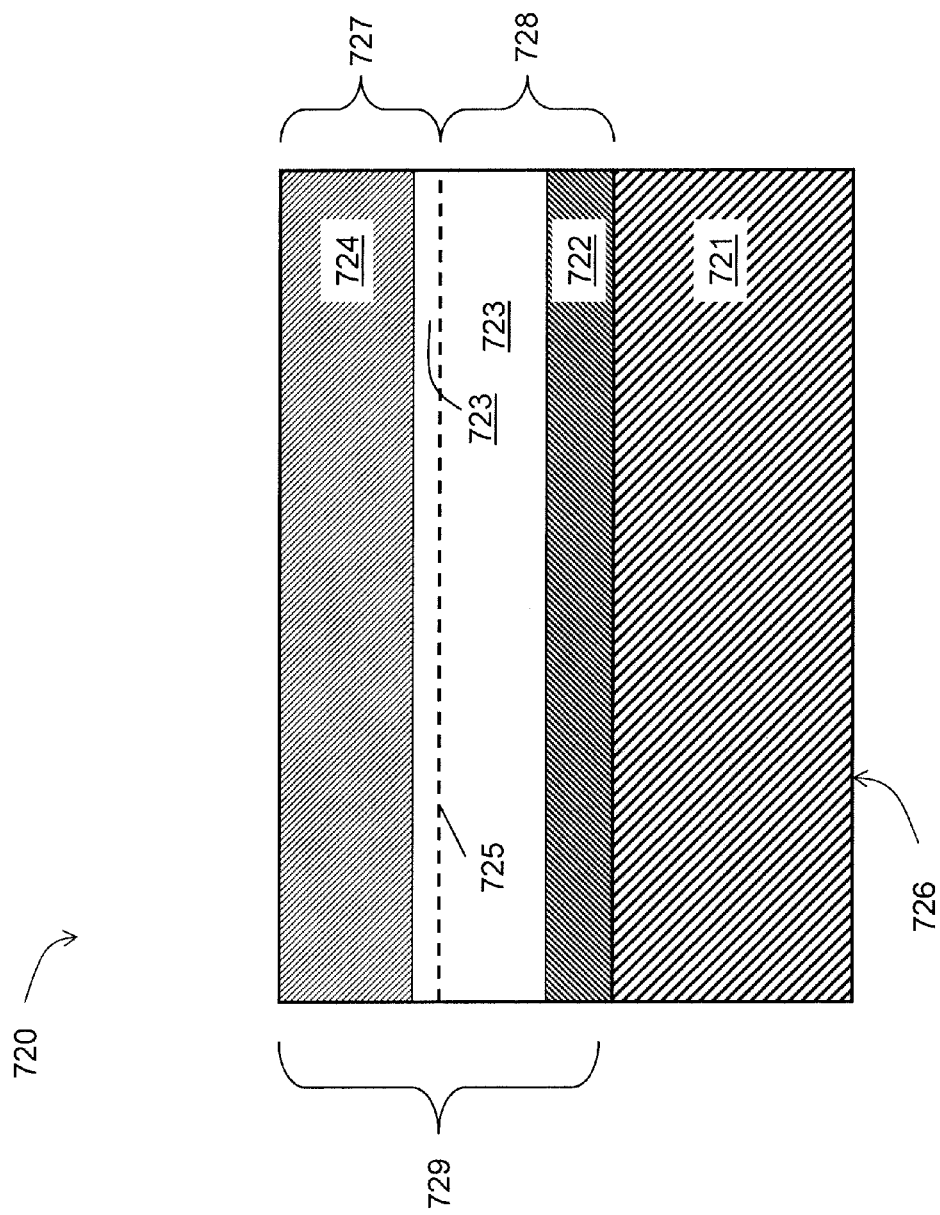
FIG. 7C illustrates a preferred wafer structure 720

Preferred Wafer Structure 720 is described with help of FIG. 7C and comprises of epilayers 729 grown on a native substrate 721. The epilayers 729 comprise transition layers 728 and active layers 727. The active layers 727 comprise a multiplicity of layers that make up a light emitting and/or light guiding layers of light emitting devices, such as a laser, light-emitting diode, or a superluminescent diode wherein the gallium nitride growth is either non-polar or N-facing. In this latter case, wafers with preferred design 720, but not limited to design 720, are provided as starting material to process 200. Preferred method 200 may be used for all cubic crystals in which the growth direction does not matter, such as, GaAs, InP, Si, SiC, SiGe, etc.

The preferred wafer structures 700 and 720 may be grown by metal-organic chemical-vapor deposition process or molecular beam epitaxy, as is well known in the art.

Figure 7D:
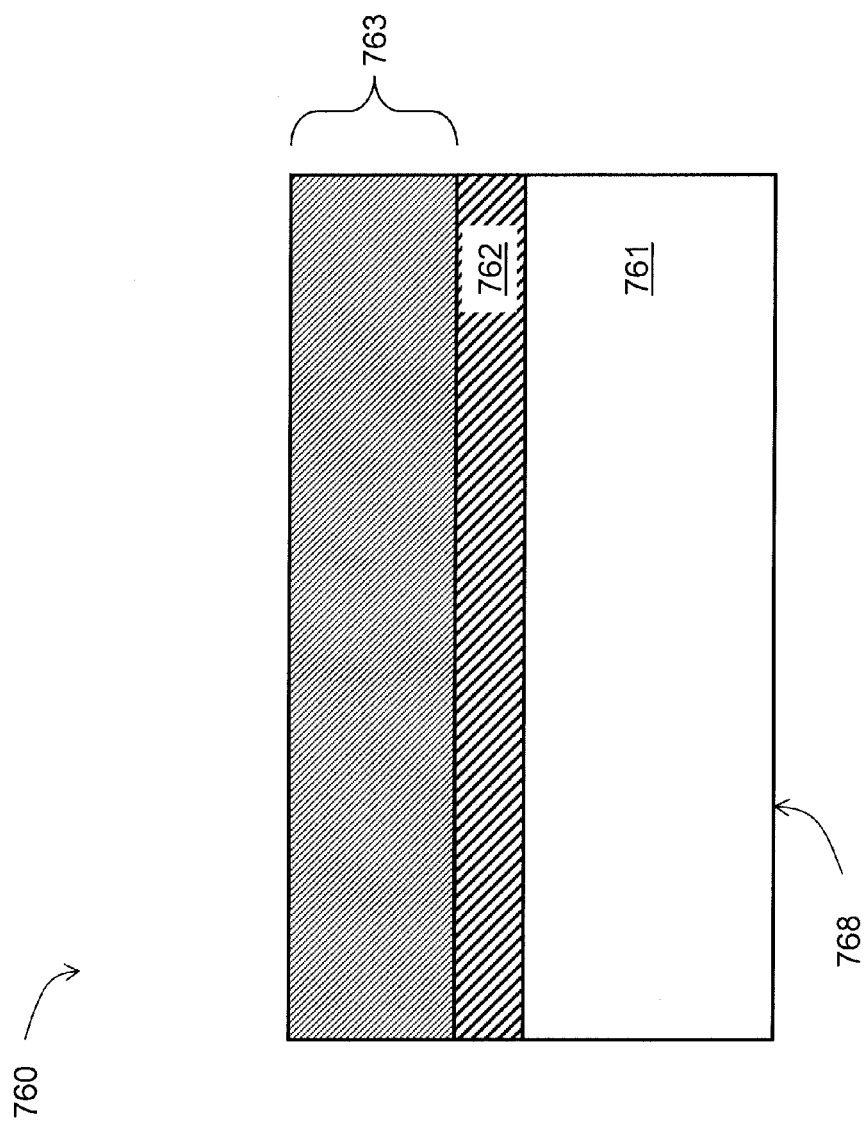
FIG. 7D illustrates a preferred wafer structure 760

Preferred Wafer Structure 760 is described with help of FIG. 7D and comprises a diamond-growth nucleation layer 762 disposed on top of a diamond wafer 761, and epitaxial layers 763 disposed on top of the diamond-growth nucleation layer 762. In one embodiment, the epitaxial layer 763 corresponds to the active layers of a HEMT. The epitaxial layers 763 may comprise any binary, ternary, quaternary alloys combining Ga, Al, In, B, and N atoms. In one embodiment, the diamond-growth nucleation layer 762 has thickness between 1 nm and 50 nm. In another embodiment, the diamond-growth nucleation layer 762 is made out of silicon nitride. In yet another embodiment, the diamond-growth nucleation layer 762 is made out of amorphous or polycrystalline material. In yet another embodiment, the total thickness of the epitaxial layers 763 is preferably 500 nm, and yet in another embodiment, the thickness is between 100 nm and 2000 nm.

Figure 7E:
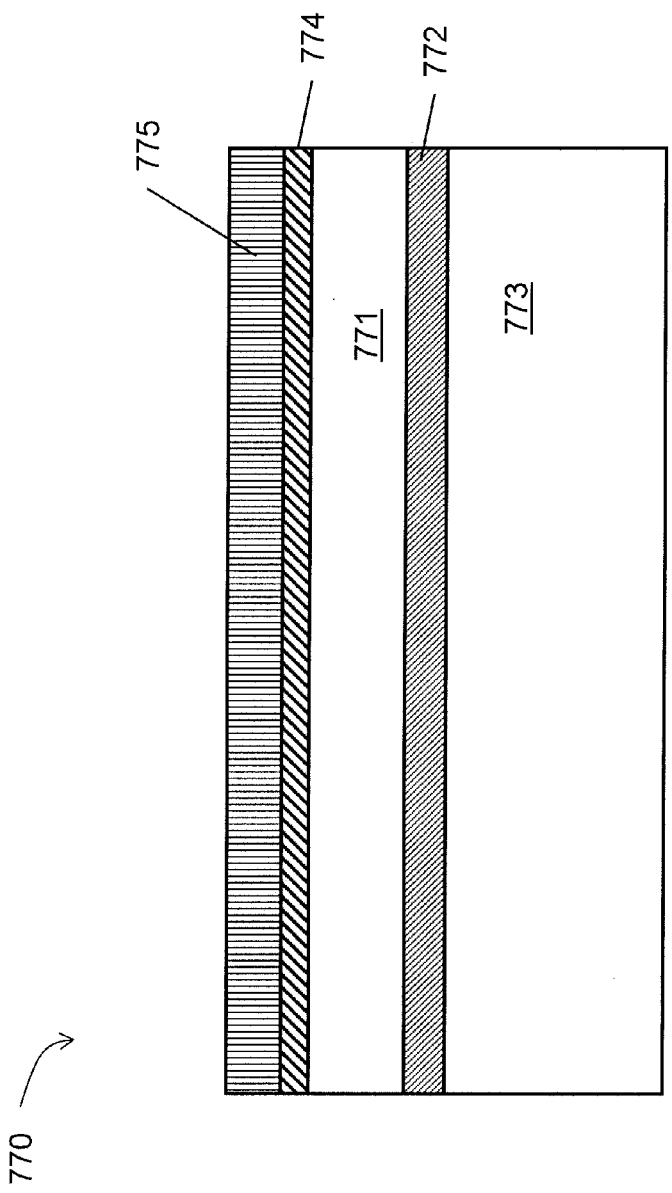
FIG. 7E illustrates a preferred wafer structure 770

Preferred Wafer Structure 770 is described with help of FIG. 7E and comprises of, from top to bottom: active epilayers 775, diamond-growth nucleation layer 774, first diamond layer 771, buried metal layer 772, and second diamond layer 773. In one embodiment, the active epilayers 775 have at least one layer made out of GaN. In another embodiment, the topmost surface is made out of an alloy that includes one or more of the following elements: Ga, Al, In, B, and N. The preferred thickness of the first diamond layer is 100 um±20 um, while the preferred thickness of the second diamond layer is between 200 um and 1500 um. The buried metal layer has preferred thickness between 10 um and 50 um. In one embodiment, the buried metal layer comprises at least one refractory metal element such as titanium in elemental or in the form of titanium containing alloy, or a compound of titanium such as titanium silicide. In one embodiment, the layered structure 770 is that of a HEMT, Schottky diode or a microwave switching or mixing diode. In another embodiment, the epilayer structure is that of a semiconductor laser, light-emitting diode, or a supeluminescent diode.

Figure 7F:
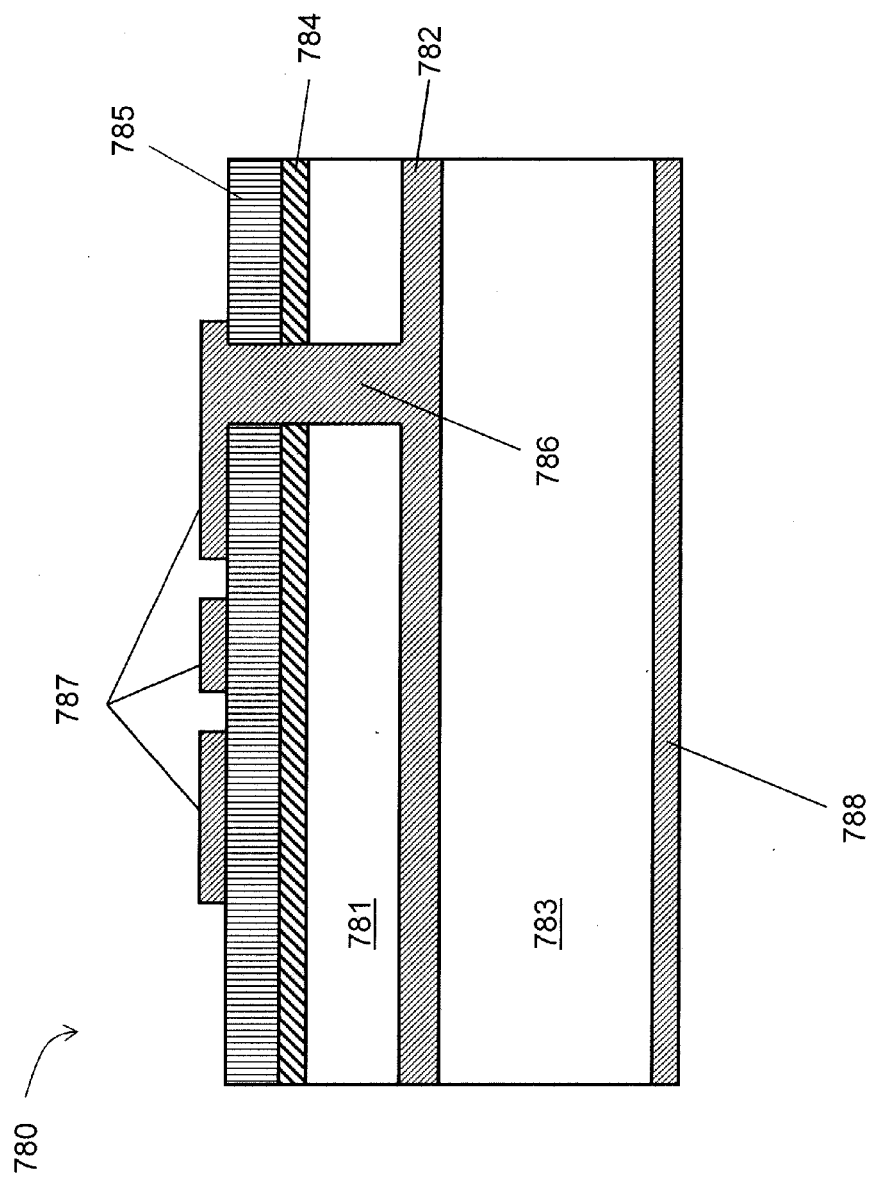
FIG. 7F illustrates a preferred wafer structure 780

Preferred Wafer/Chip Structure 780 is described with help of FIG. 7F and comprises of, from top to bottom: active epilayers 785, diamond-growth nucleation layer 784, first diamond layer 781, buried metal layer 782, and second diamond layer 783, and back surface metal 788. The preferred structure further comprises metal contacts 787 on top of the active layer 785, and at least one via 786 providing electrical contact between at least one of the top contacts 787 and the buried metal layer 782. In one embodiment, the active epilayers 775 have at least one layer made out of GaN. In another embodiment, the topmost surface is made out of an alloy that includes one or more of the following elements: Ga, Al, In, B, and N. The preferred thickness of the first diamond layer 781 is 100 um±20 um, while the preferred thickness of the second diamond layer 783 is between 200 um and 1500 um. The buried metal layer has preferred thickness between 10 um and 50 um. In one embodiment, the buried metal layer comprises at least titanium.

In one embodiment, the layered structure 770 is that of a HEMT, Schottky diode or a microwave switching or mixing diode. In another embodiment, the epilayer structure is that of a semiconductor laser, light-emitting diode, or a supeluminescent diode. In one embodiment, via 786 protrudes from the top metal contact 787 to the buried metal layer 782. The wafer 780 is preferably separated into chips for attachment and use. The essential difference between this composite chips with two diamond layers and the use of a diamond heatsink to spread the heat from a chip mounted on its surface is that in this invention, the size of both of the diamond layers is substantially equal, wherein conventionally, diamond heatsinks are larger than the chip they cool.

Figure 7G:
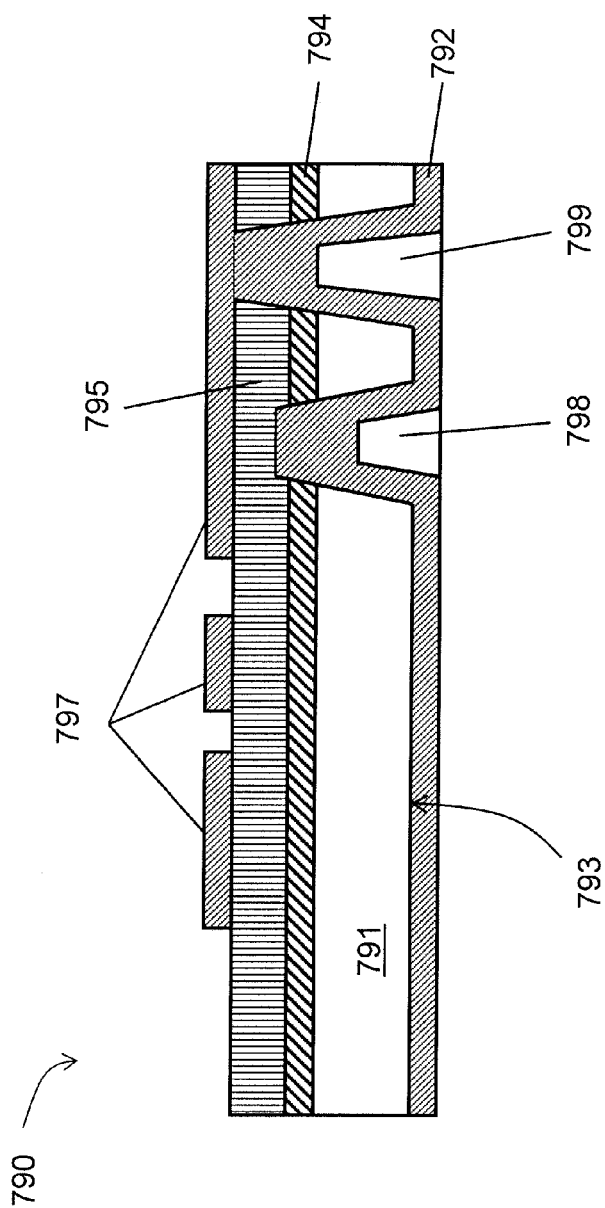
FIG. 7G illustrates a preferred wafer structure 790

Preferred Wafer/Chip Structure 790 is described with help of FIG. 7G and comprises of, from top to bottom: active epilayers 795, diamond-growth nucleation layer 794, a diamond layer 791, back-side contact metallization 792, front metal contacts 787 on top of the active layer 795, and at least one via 798 or 799 providing electrical contact between at least one of the top contacts 797 and the back metal contact layer 792. In one embodiment, the active epilayers 795 have at least one layer made out of GaN. In another embodiment, the topmost surface is made out of an alloy that includes one or more of the following elements: Ga, Al, In, B, and N. The preferred thickness of the t diamond layer 791 is 100 um±20 um In one embodiment, the via 798 protrudes from the back contact 792 towards the front and stops within the active layer 795. The via is coated with metal from the inside. In another embodiment, a via 799 protrudes from the back surface 793 of the diamond 791, through the diamond wafer 791, and terminates at the back of the front metallization 797. The wafer 790 will preferably be separated into chips for attachment and use. In one embodiment, the layered structure 790 is that of a HEMT, Schottky diode or a microwave switching or mixing diode. In another embodiment, the epilayer structure is that of a semiconductor laser, light-emitting diode, or a superluminescent diode.

The preferred process for manufacturing backside vias shown in exemplary electronic or optoelectronic device in FIG. 7G comprises of (a) providing a device wafer having a top surface and a back surface, the device wafer comprising, starting from the back surface towards the top surface, a diamond substrate 791, diamond-growth nucleation layer 794, active layers 795, and front contact metallization 797 in at least one area top of the active layers 795, (b) laser-drilling starting from the back surface of the device wafer, a hole having a depth of at least one half of the device wafer thickness and terminating before it reaches the diamond-growth nucleating layer; (c) patterning the back of the wafer with photoresist that has openings over the vias; (d) dry etching with multiple chemistries if necessary the remainder of the hole to expose diamond-growth nucleation layer 794, remove the nucleation layer 794, and expose the active layers 795. Optionally etch through the active layers to expose and stop etching on the front metal 797; and (e) metal coat the back of the device wafer and the interior of the vias.

Figure 8A:
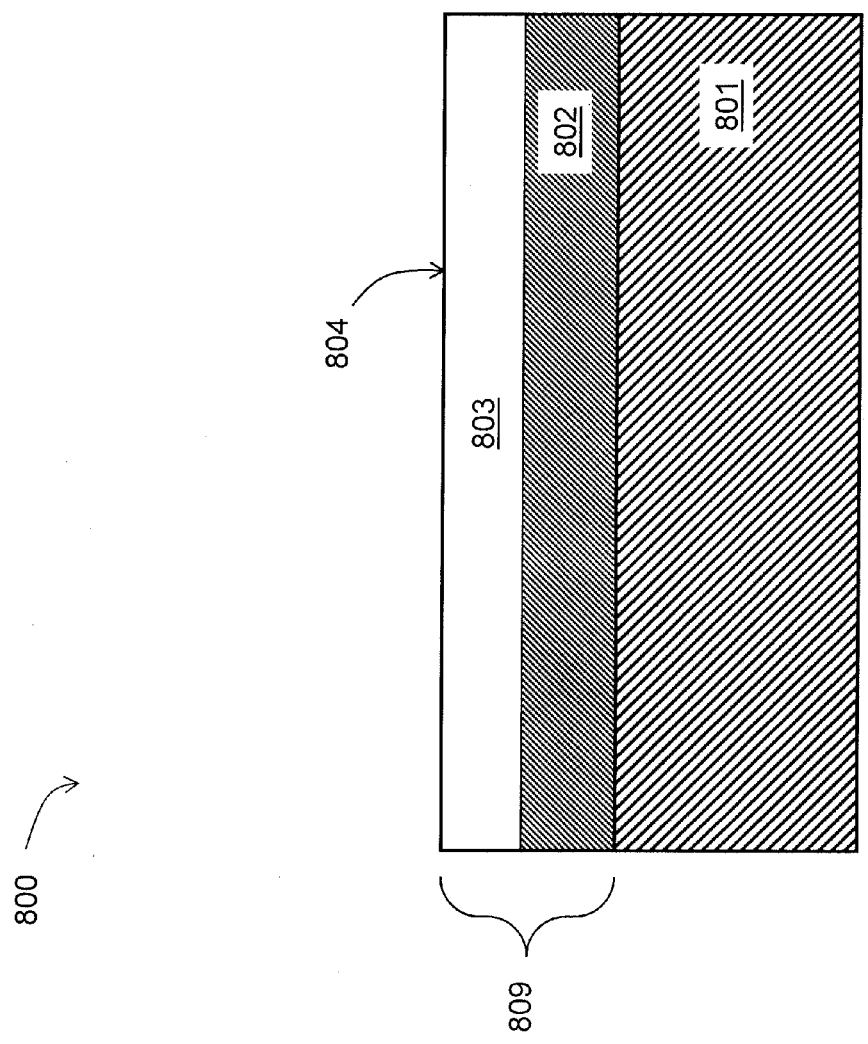
FIG. 8A illustrates a preferred wafer structure 800

Preferred Wafer Structure 800 is described with help of FIG. 8A and comprises of epilayers 809 grown on a native substrate 801. The epilayers 809 comprise transition layers 802 and template layers 803. The template layers have low defect density (high crystalline quality) sufficient to allow the growth of high quality active layer on top surface 804.

Figure 8B:
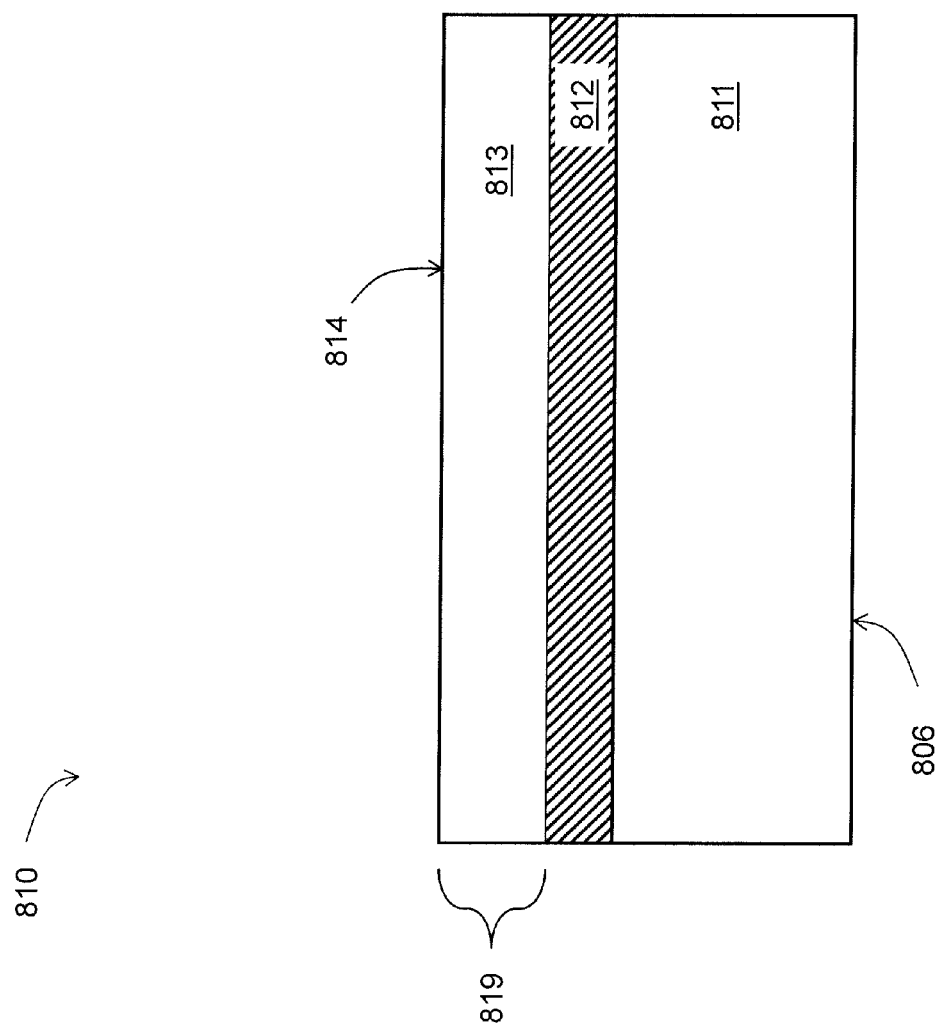
FIG. 8B illustrates a preferred wafer structure 810

Preferred Wafer Structure 810 is described with help of FIG. 8B and comprises of template layer 813, diamond-growth nucleation layer 812, and diamond layer 811. Surface 814 is revealed for growth of new epilayers.

Figure 8C:
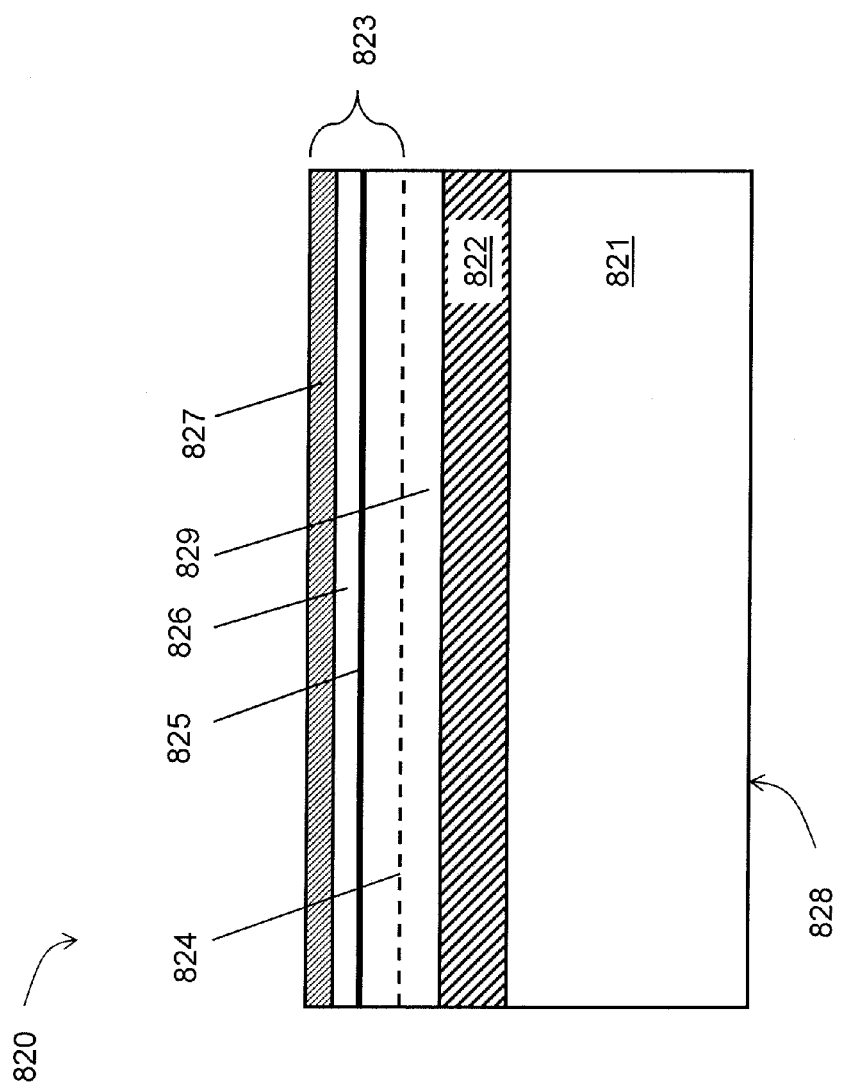
FIG. 8C illustrates a preferred wafer structure 820

Preferred Wafer Structure 820 is described with help of FIG. 8C and comprises of, top to bottom, active layers 823, template layer 829, diamond-growth nucleation layer 822, and diamond layer 821. The boundary between the template layer and the newly grown active layers is denoted with the dashed line 824. In one embodiment, the active layers comprise a 2DEG 825, AlN interface layer 826, and a barrier layer 827. In yet in another embodiment, the active layers a part of a semiconductor laser, light-emitting diode, or a superluminescent diode.

Summary of Preferred Methods and Structures

Figure 9:
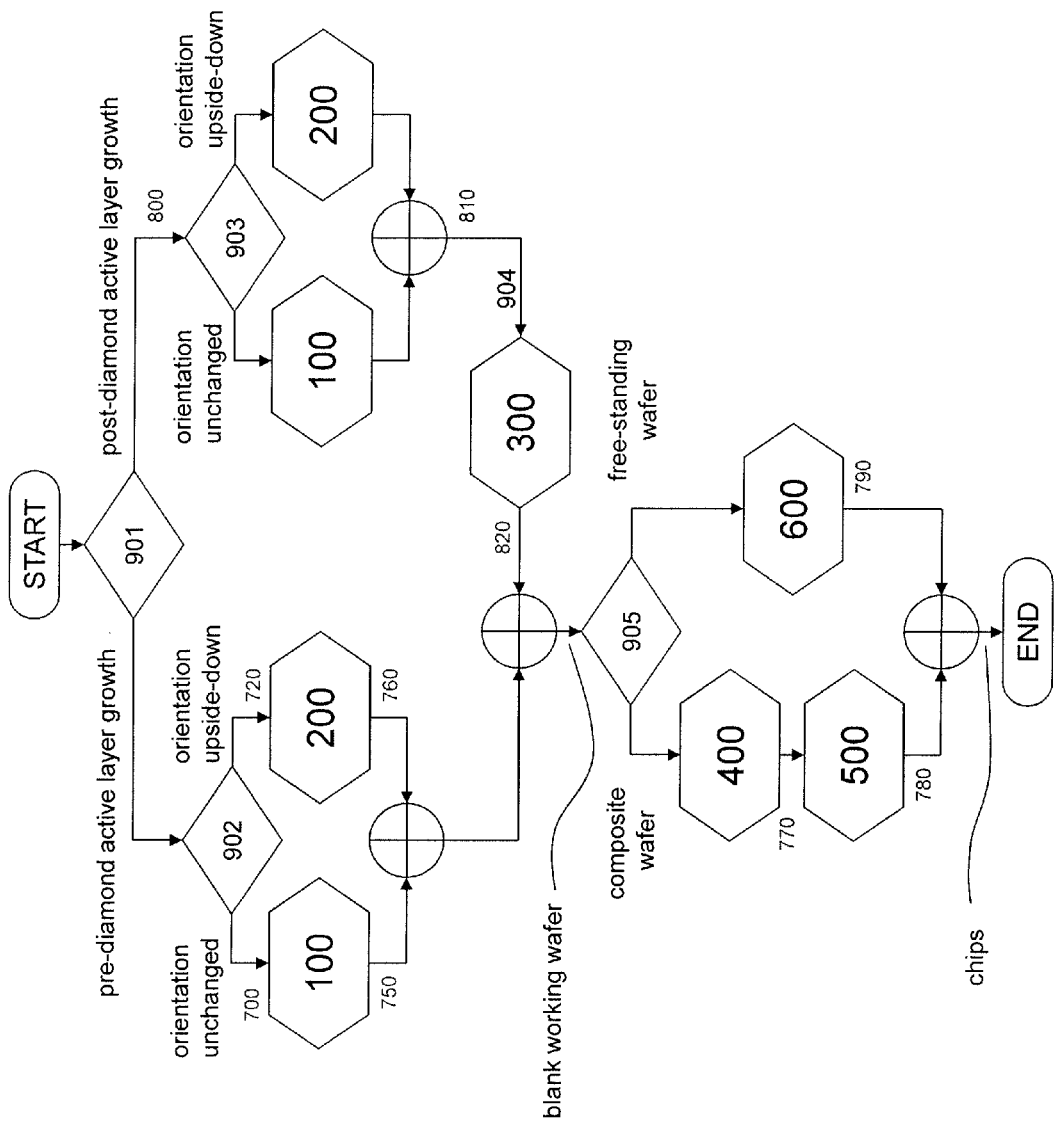
FIG. 9 shows a summary of preferred methods
Figure 10:
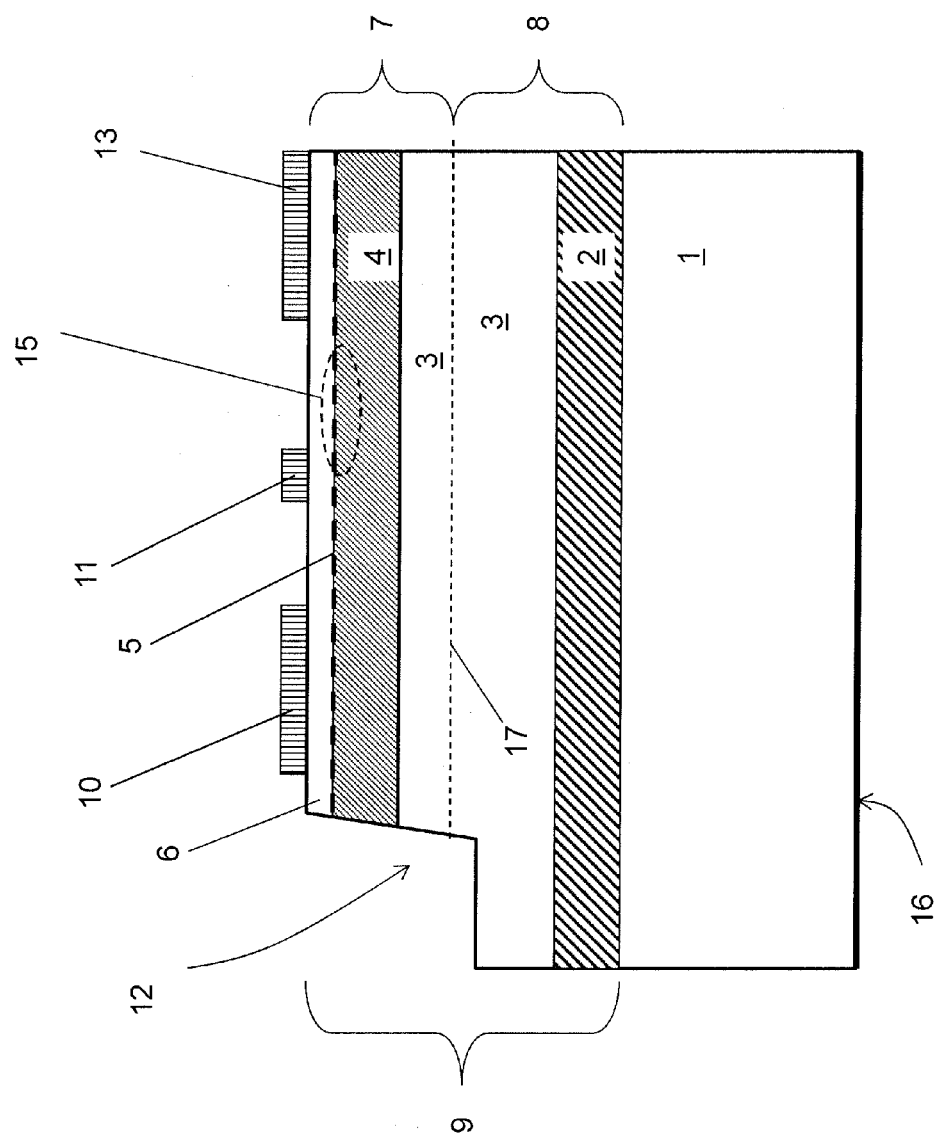
FIG. 10 illustrates AlGaN—GaN HEMT (prior art)

The preferred methods for fabricating GaN-on-diamond wafers and devices are shown in flow-chart diagram in FIG. 9. The process for the manufacture of GaN-on-diamond devices differs depending on device applications and starting wafer design. As disclosed in FIG. 9, the first decision 901 the designer has to make is whether the completed wafers will include active layers that have been formed prior to diamond growth ("pre-diamond active layer growth") or after diamond deposition ("pst-diamond active layer growth"). The difference is in at which stage the growth of the active layer occurs in the GaN-on-diamond device manufacturing. When the active layer is grown on the native substrate as it is disclosed for preferred wafer structure 700, the diamond deposition step occurring within preferred processes 100 and 200 occurs after the active layer is grown. The active layer is present on the wafer during the full duration of the processes 100 and 200. The alternative process is to grow a template or a seed layer, transfer this layer to diamond, and then grow the active layer after the diamond has been deposited as it is disclosed in the sequence of preferred methods 100 and 300. This general process sequence is referred to as the post-diamond active layer growth or the regrowth process. Each of the process alternatives has their advantage: The manufacturing of high performance devices such as millimeter-wave transistors or high-power single-mode lasers, may find the regrowth-process preferable for producing high precision active layers after the diamond growth has been completed, because of potential diffusion of dopants across very thin layers even though regrowth increases processing cost and complexity. The as-grown active layer process may be favored by electronic devices used in power management where relatively thick epilayers and micron-level lithography can be used and cost is more critical production criteria.

The next decision the designer has to make whether the as-grown epilayers will appear on the diamond substrate in the same orientation as they were grown or will they appear upside down—step 902. Similarly, if only a template for regrowth is to be transferred to diamond, will this template appear on the diamond wafer in the same direction as it was grown or upside down—step 903. This choice is of critical importance to manufacturers of AlGaN/GaN HEMTs which greatly rely on the presence of intrinsic piezoelectric and spontaneous polarization in the hexagonal AlGaN material system which favors growing materials on the Ga-face of GaN. Hence, for this type of devices, the orientation between the active layers before and after epilayer transfer to the diamond substrate has to remain unchanged, i.e., orientation unchanged. Preferred method 100 maintains the original epilayer orientation. Similarly, to regrow a HEMT active layer that relies on the same spontaneous and piezoelectric spontaneous effects, the template has to be Ga-facing. Hence the preferred method 100 will be used.

However, there are many new developments today in GaN technology and it is conceivable that in the future non-polar and N-face surfaces of GaN will become commercially used. For this type of devices, it may be advantageous to turn the epilayer orientation upside during the epilayer transfer to diamond. In one embodiment, N-face grown template turned upside down during transfer to diamond can be used for regrowth of Ga-facing devices. The preferred method 200 allows flips the active layer upside down during the epilayer transfer and in doing so simplifies the process. Similarly, for most cubic III-V semiconductors the orientation change during processes 100 or 200 may be immaterial since the growth direction will not have noticeable effect on the device performance. In this case, the method 200 may be preferred.

The result of processes 100 and 200 in FIG. 9 is a blank working wafer with GaN epilayers on one side and rough diamond substrate on the other. In step 904, the active layers are grown on top of the template of the working wafer.

In step 905, the designer decides whether the blank working wafer shall be processed as a free-standing wafer or as a diamond-metal-diamond composite wafer. If the size and the thickness of the working wafer allow it, free-standing GaN-on-diamond wafer processing is practical. For example, wafers with diameter of 24 mm can be efficiently processed at thickness of 100 um. For larger wafers, thicker diamond layers are necessary. The processing of free-standing wafers, preferred vias drilling is disclosed in preferred method 600. When large wafers with high flatness are necessary, a composite wafer is constructed using the preferred method 400. The composite diamond-on-diamond wafers are constructed using preferred method 400 and processed according to the preferred method 500.

Detailed Wafer Structure and Process Embodiment Descriptions (a) 100-400-500. In one embodiment of preferred method for the manufacturing of high-quality GaN-on-diamond wafers and devices, an as-grown wafer M100 with preferred structure 700 is provided as input to the preferred method 100. The structure of the wafer resulting from process 100 may be, but is not limited to preferred wafer structure 750. The working wafer M111 resulting from process 100 is then provided as input wafer M400 to process 400. The structure of the wafer resulting from process 400 may be, but is not limited to preferred wafer structure 770. In another embodiment, the resulting composite wafer M405 is further processed into devices using process 500, resulting in chips M506 which may have, but are not limited to chip or wafer structure 780.

(b) 100-600. In one embodiment of preferred method for the manufacturing of high-quality GaN-on-diamond wafers and devices, an as-grown wafer M100 with preferred structure 700 is provided as input to the preferred method 100. The structure of the wafer resulting from process 100 may be, but is not limited to preferred wafer structure 750. The working wafer M111 resulting from process 100 is then provided as input wafer M600 to process 600. The structure of the wafer resulting from process 600 may be, but is not limited to preferred wafer or chip structure 790.

(c) 200-400-500. In one embodiment of preferred method for the manufacturing of high-quality GaN-on-diamond wafers and devices, an as-grown wafer M200 with preferred structure 720 is provided as input to the preferred method 200. The structure of the wafer resulting from process 200 may be, but is not limited to preferred wafer structure 760. The working wafer M205 resulting from process 200 is then provided as input wafer M400 to process 400. The structure of the wafer resulting from process 400 may be, but is not limited to preferred wafer structure 770. In another embodiment, the resulting composite wafer M405 is further processed into devices using process 500, resulting in chips M506 which may have, but are not limited to chip or wafer structure 780.

(d) 200-600. In one embodiment of preferred method for the manufacturing of high-quality GaN-on-diamond wafers and devices, an as-grown wafer M200 with preferred structure 720 is provided as input to the preferred method 200. The structure of the wafer resulting from process 200 may be, but is not limited to preferred wafer structure 760. The working wafer M205 resulting from process 200 is then provided as input wafer M600 to process 600. The structure of the wafer resulting from process 600 may be, but is not limited to preferred wafer or chip structure 790.

(e) 100-300-400-500. In one embodiment of preferred method for the manufacturing of high-quality GaN-on-diamond wafers and devices, an as-grown wafer M100 with preferred structure 800 is provided as input to the preferred method 100. The structure of the wafer resulting from process 100 may be, but is not limited to preferred wafer structure 810. The working wafer M111 resulting from process 100 is then provided as input wafer M300 to process 300. The structure of the working wafer M303 resulting from process 300 may be, but is not limited to preferred wafer structure 820. In another embodiment, the resulting working wafer M303 is provided as input wafer M400 to process 400. The structure of the wafer resulting from process 400 may be, but is not limited to preferred wafer structure 770. In another embodiment, the resulting composite wafer M405 is further processed into devices using process 500, resulting in chips M506 which may have, but are not limited to chip or wafer structure 780.

(f) 200-300-400-500. In one embodiment of preferred method for the manufacturing of high-quality GaN-on-diamond wafers and devices, an as-grown wafer M200 with preferred structure 800 is provided as input to the preferred method 100. The structure of the wafer resulting from process 200 may be, but is not limited to preferred wafer structure 810. The working wafer M205 resulting from process 200 is then provided as input wafer M300 to process 300. The structure of the working wafer M303 resulting from process 300 may be, but is not limited to preferred wafer structure 820. In another embodiment, the resulting working wafer M303 is provided as input wafer M400 to process 400. The structure of the wafer resulting from process 400 may be, but is not limited to preferred wafer structure 770. In another embodiment, the resulting composite wafer M405 is further processed into devices using process 500, resulting in chips M506 which may have, but are not limited to chip or wafer structure 780.

(g) 100-300-600. In one embodiment of preferred method for the manufacturing of high-quality GaN-on-diamond wafers and devices, an as-grown wafer M100 with preferred structure 800 is provided as input to the preferred method 100. The structure of the wafer resulting from process 100 may be, but is not limited to preferred wafer structure 810. The working wafer M111 resulting from process 100 is then provided as input wafer M300 to process 300. The structure of the wafer M303 resulting from process 300 may be, but is not limited to preferred wafer structure 820. The working wafer M303 resulting from process 300 is then provided as input wafer M600 to process 600. The structure of the wafer resulting from process 600 may be, but is not limited to preferred wafer or chip structure 790.

(h) 200-300-600. In one embodiment of preferred method for the manufacturing of high-quality GaN-on-diamond wafers and devices, an as-grown wafer M200 with preferred structure 800 is provided as input to the preferred method 200. The structure of the wafer resulting from process 200 may be, but is not limited to preferred wafer structure 810. The working wafer M205 resulting from process 200 is then provided as input wafer M300 to process 300. The structure of the wafer M303 resulting from process 300 may be, but is not limited to preferred wafer structure 820. The working wafer M303 resulting from process 300 is then provided as input wafer M600 to process 600. The structure of the wafer resulting from process 600 may be, but is not limited to preferred wafer or chip structure 790.

Figure 11:
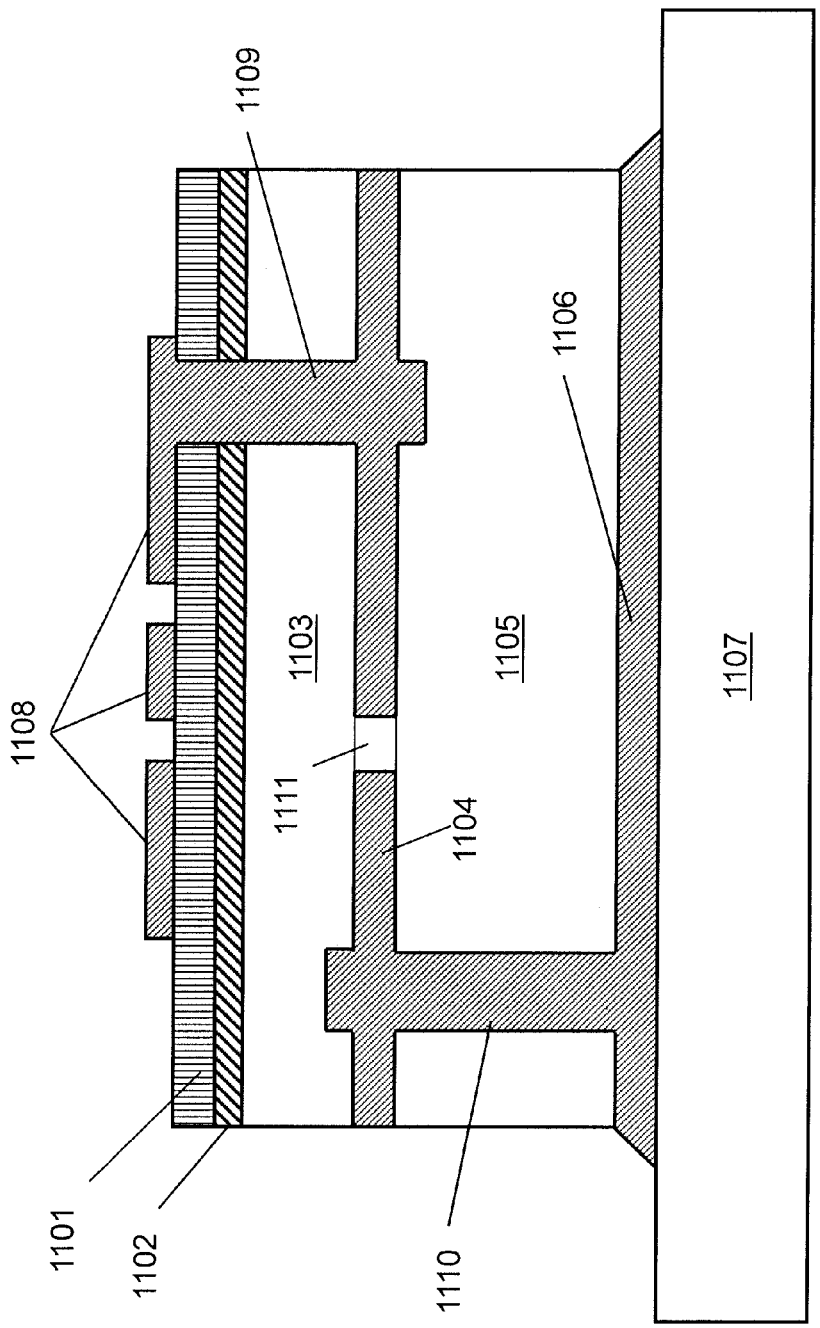
FIG. 11 illustrates a preferred embodiment of wafer structure 780 with two sets of blind vias drilled from both sides and device mounted on a heatsink.
Figure 12:
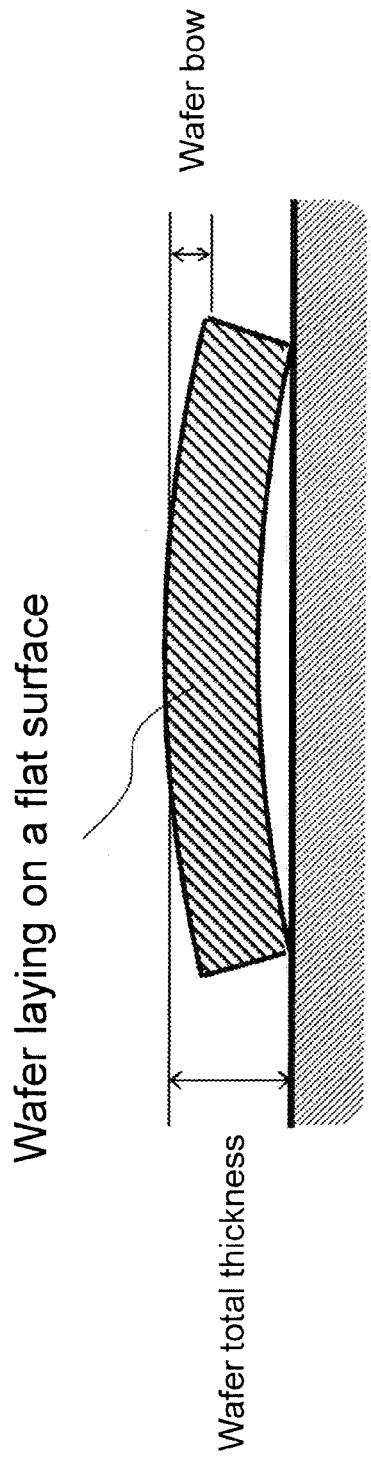
FIG. 12 illustrates definition of bow.

Preferred chip structure 1100 that may result from processes 400 and 500 is explained with the help of FIG. 11. The referred high-performance GaN-on-diamond chip comprises a buried metal layer 1104 sandwiched between a first diamond layer 1103 and a second diamond layer 1105, a diamond-growth nucleating layer 1102 disposed on top of the first diamond, and a device active layer structure 1101 disposed on top of the nucleating layer 1102, wherein the diamond-growth nucleating layer 1102 comprises amorphous or polycrystalline dielectric. In one embodiment, the nucleating layer 1102 is made out of silicon nitride, and in another embodiment it is made out of aluminum nitride. The preferred chip structure 1100 furthermore comprises at least one first via 1109 extending through the first diamond layer 1103, but not through the second diamond layer 1105. The first via 1109 may partially protrude into the second diamond layer 1105. The chip 1100 furthermore comprises front metal contact pattern 1108, and the at least one first via is coated with a metal that electrically couples the front contact pattern with the buried metal layer 1104. The first via 1109 may be filled with metal (as shown in FIG. 11) or hollow and coated on the edges with metal without departing from the invention. The chip 1100 may furthermore comprise at least one second via 1110 extending through the second diamond layer 1105, but not through the first diamond layer. The second via 1110 may partially protrude into the first diamond layer 1103. The chip 1100 furthermore comprises back metal contact 1106, and the at least one second via 1110 is coated with a metal that electrically couples the back contact pattern with the buried metal layer 1104. The second via 1110 may be filled with metal (as shown in FIG. 11) or hollow and coated on the edges with metal without departing from the invention. In another embodiment, the buried metal 1104 may be patterned prior to brazing thereby generating buried patterned metallization within the diamond-metal-diamond sandwich. This indicated with an optional discontinuity in the buried metal layer shown with 1111.

While certain representative embodiments and details have been shown for purposes of illustrating the invention, it will be apparent to those skilled in the art that various changes in the methods and apparatus disclosed herein may be made without departing from the scope of the invention which is defined in the appended claims.

What is claimed is:

1. A device comprising:
    a first diamond layer having a first thickness and a first lateral dimension;
    a second diamond layer having a second thickness and a second lateral dimension;
    a buried metal layer sandwiched between said first diamond layer and second diamond layer;
    a semiconductor layer;
    a dielectric layer sandwiched between said semiconductor layer and said second diamond layer;
    at least one electrical contact disposed on the surface of said semiconductor layer; and
    at least one metalized via.

2. The device of claim 1, wherein said metalized via extends from said at least one electrical contact to said buried metal layer.

3. The device of claim 1, wherein said semiconductor layer at least in part comprises of gallium nitride.

4. The device of claim 1, wherein said dielectric layer is made out of amorphous silicon nitride.

5. The device of claim 2, wherein said first lateral dimension and said second lateral dimension are substantially equal.

6. The device of claim 2, wherein said first thickness is larger than the said second thickness.

7. The device of claim 1, wherein said first thickness is between 20 micrometers and 200 micrometers.

8. The device of claim 1 further comprising a back-side metal layer adjacent to said first diamond layer.

9. The device of claim 8, wherein said at least one metalized via extends from said buried metal layer to said back-side metal layer.

10. The device of claim 8, wherein said at least one metalized via extends from said at least one electrical contact to said back-side metalized layer.

11. The device of claim 2, wherein said device is one of a group comprising of high-electron mobility transistor, microwave integrated circuit, mixing diode, switching diode, and transmission line.

12. The device of claim 1, wherein said second diamond layer has thickness between 0.02 mm and 0.3 mm.

13. The device of claim 1, wherein said first diamond layer has thickness between 0.2 mm and 1.5 mm.

14. The device of claim 1, wherein said buried metal layer has thickness between 0.01 mm and 0.05 mm.

* * * * *